(12) United States Patent
Park et al.

(10) Patent No.: US 12,294,015 B2
(45) Date of Patent: May 6, 2025

(54) DISPLAY DEVICE

(71) Applicant: Samsung Display Co., LTD., Yongin-si (KR)

(72) Inventors: Ju Chan Park, Seoul (KR); Sun Ho Kim, Seongnam-si (KR); Ja Eun Lee, Suwon-si (KR); Pil Suk Lee, Suwon-si (KR); Chung Sock Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 463 days.

(21) Appl. No.: 17/722,543

(22) Filed: Apr. 18, 2022

(65) Prior Publication Data

US 2023/0020926 A1 Jan. 19, 2023

(30) Foreign Application Priority Data

Jul. 8, 2021 (KR) ........................ 10-2021-0089534

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ..... H01L 33/62; H01L 25/167; H10K 59/123; H10K 59/353; H10K 59/121; H10K 59/35; H10K 50/125
See application file for complete search history.

(56) References Cited

U.S. PATENT DOCUMENTS

| | | | |
|---|---|---|---|
| 2018/0047799 A1* | 2/2018 | Lim | H10K 59/123 |
| 2018/0151850 A1* | 5/2018 | Lee | H10K 71/00 |
| 2019/0140025 A1* | 5/2019 | Wang | H05K 1/028 |
| 2021/0020716 A1* | 1/2021 | Kim | H10K 59/123 |
| 2021/0208633 A1* | 7/2021 | Ma | G02F 1/13306 |
| 2022/0028938 A1* | 1/2022 | Zhao | H10K 59/131 |
| 2022/0310761 A1 | 9/2022 | Kim et al. | |
| 2022/0320245 A1* | 10/2022 | Qu | G09G 3/3233 |

FOREIGN PATENT DOCUMENTS

| KR | 10-2018-0018960 | 2/2018 |
|---|---|---|
| KR | 10-2021-0010716 | 1/2021 |
| KR | 10-2022-0133361 | 10/2022 |

* cited by examiner

*Primary Examiner* — Shaun M Campbell
(74) *Attorney, Agent, or Firm* — KILE PARK REED & HOUTTEMAN PLLC

(57) ABSTRACT

A display device includes a first display area and a second display area; a first pixel circuit part positioned on the first display area; a first light-emitting element electrically connected to the first pixel circuit part; a second pixel circuit part positioned in the second display area; second light-emitting elements electrically connected to the second pixel circuit part; and a driving circuit part electrically connected to the first pixel circuit part and the second pixel circuit part and overlapping the second light-emitting elements in a plan view.

22 Claims, 25 Drawing Sheets

FIG. 11
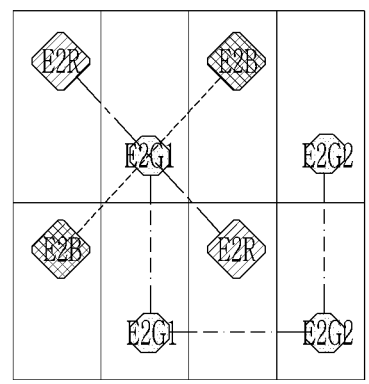
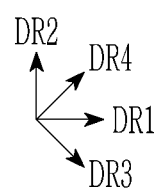

FIG. 19
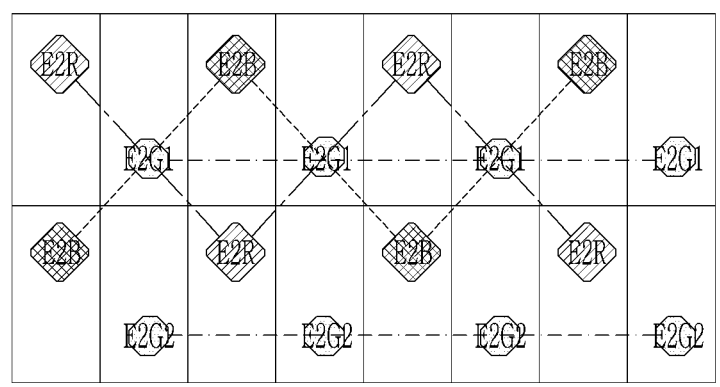
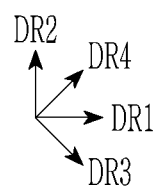

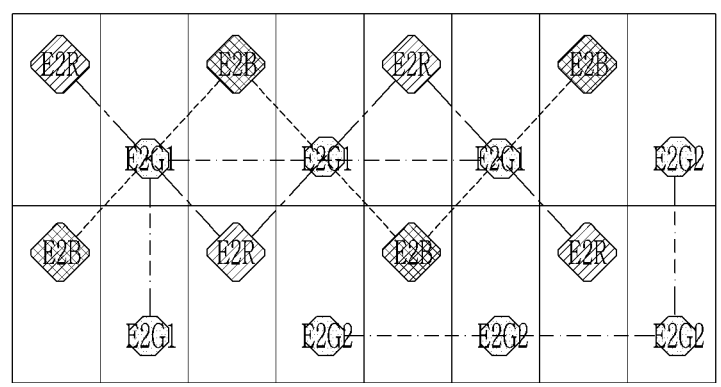
FIG. 20
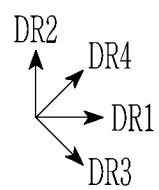

FIG. 21
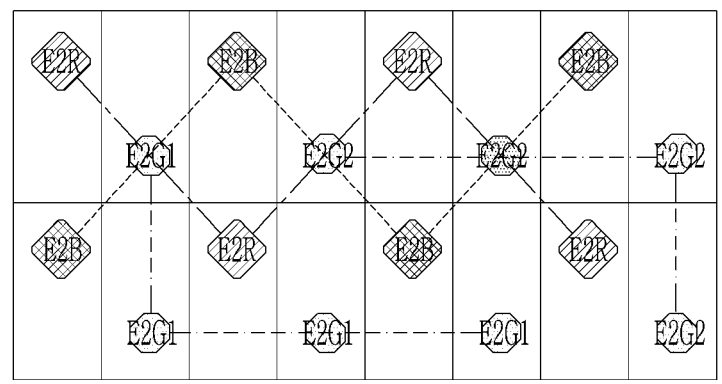
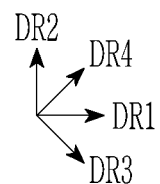

FIG. 23
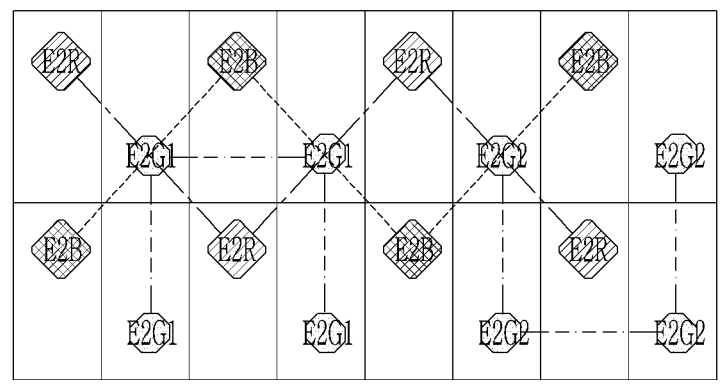
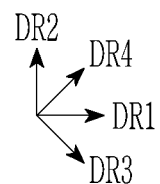

FIG. 25
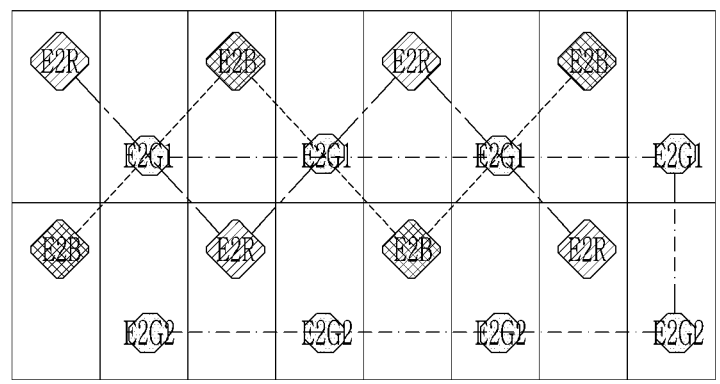
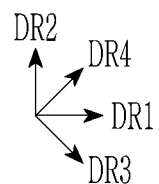

DISPLAY DEVICE

CROSS-REFERENCE TO RELATED APPLICATION(S)

This application claims priority to and the benefit of Korean Patent Application No. 10-2021-0089534 under 35 U.S.C. § 119, filed in the Korean Intellectual Property Office (KIPO) on Jul. 8, 2021, the entire contents of which are incorporated herein by reference.

BACKGROUND

1. Technical Field

The disclosure relates to a display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device may include a display area in which a screen is displayed and a peripheral area in which the screen is not displayed. In the display area, pixels may be disposed in a row direction and a column direction. Within each pixel, various elements such as transistors, capacitors, etc. and various wires that may supply signals to these elements may be positioned. In the peripheral area, various wires, scan drivers, data drivers, and controllers that transmit electrical signals to drive these pixels may be positioned.

There is an increasing demand to reduce the size of the peripheral area and enlarge the display area, but there is a problem that it is difficult to reduce the size of the peripheral area as the area occupied by the driving unit is increased in the process of implementing high resolution and high speed driving.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device of which the display area is expanded.

A display device according to an embodiment includes a first display area and a second display area; a first pixel circuit part positioned in the first display area of the substrate; a first light-emitting element electrically connected to the first pixel circuit part; a second pixel circuit part positioned on the second display area; second light-emitting elements electrically connected to the second pixel circuit part; and a driving circuit part electrically connected to the first pixel circuit part and the second pixel circuit part and overlapping the second light-emitting elements in a plan view.

The second pixel circuit part may include a first sub-pixel circuit part, a second sub-pixel circuit part, a third sub-pixel circuit part, and a fourth sub-pixel circuit part, and the second light-emitting elements may include first sub-light-emitting elements electrically connected to the first sub-pixel circuit part, second sub-light-emitting elements electrically connected to the second sub-pixel circuit part, third sub-light-emitting elements electrically connected to the third sub-pixel circuit part, and fourth sub-light-emitting elements electrically connected to the fourth sub-pixel circuit part.

The first sub-light-emitting elements may emit red light, the second sub-light-emitting elements may emit blue light, and the third sub-light-emitting elements and the fourth sub-light-emitting elements may emit green light.

The first sub-pixel circuit part and the third sub-pixel circuit part may be adjacent in a first direction, the second sub-pixel circuit part and the fourth sub-pixel circuit part may be adjacent in the first direction, the first sub-pixel circuit part and the second sub-pixel circuit part may be adjacent in a second direction perpendicular to the first direction, and the third sub-pixel circuit part and the fourth sub-pixel circuit part may be adjacent in the second direction.

The first sub-pixel circuit part may be electrically connected to two of the first sub-light-emitting elements, the second sub-pixel circuit part may be electrically connected to two of the second sub-light-emitting elements, the third sub-pixel circuit part may be electrically connected to two of the third sub-light-emitting elements, and the fourth sub-pixel circuit part may be electrically connected to two of the fourth sub-light-emitting elements.

The two of the first sub-light-emitting elements electrically connected to the first sub-pixel circuit part may be disposed in a third direction oblique to the first direction and the second direction, the two of the second sub-light-emitting elements electrically connected to the second sub-pixel circuit part may be disposed in a fourth direction oblique to the first direction and the second direction, the two of the third sub-light-emitting elements electrically connected to the third sub-pixel circuit part may be disposed in one of the first direction, the second direction, the third direction, and the fourth direction, and the two of the fourth sub-light-emitting elements electrically connected to the fourth sub-pixel circuit part may be disposed in one of the first direction, the second direction, the third direction, and the fourth direction.

The third sub-light-emitting element and the fourth sub-light-emitting element may be electrically connected to each other.

The first sub-pixel circuit part and the second sub-pixel circuit part may be adjacent in a first direction, the third sub-pixel circuit part and the fourth sub-pixel circuit part may be adjacent in the first direction, the first sub-pixel circuit part and the third sub-pixel circuit part may be adjacent in a third direction oblique to the first direction, and the second sub-pixel circuit part and the fourth sub-pixel circuit part may be adjacent in the third direction.

The first sub-pixel circuit part may be electrically connected to three of the first sub-light-emitting elements, the second sub-pixel circuit part may be electrically connected to three of the second sub-light-emitting elements, the third sub-pixel circuit part may be electrically connected to three of the third sub-light-emitting elements, and the fourth sub-pixel circuit part may be electrically connected to three of the fourth sub-light-emitting elements.

the three of the first sub-light-emitting elements electrically connected to the first sub-pixel circuit part may be positioned at each vertex of a first imaginary triangle, the three of the second sub-light-emitting elements electrically connected to the second sub-pixel circuit part maybe positioned at each vertex of a second imaginary triangle, the three of the third sub-light-emitting elements electrically connected to the third sub-pixel circuit part may be disposed in the first direction, and the three of the fourth sub-light-emitting elements connected to the fourth sub-pixel circuit part may be disposed in the first direction.

The third sub-light-emitting element and the fourth sub-light-emitting element may be electrically connected to each other.

The three of the first sub-light-emitting elements electrically connected to the first sub-pixel circuit part may be positioned at each vertex of a first imaginary triangle, the three of the second sub-light-emitting elements electrically connected to the second sub-pixel circuit part may be positioned at each vertex of a second imaginary triangle, the three of the third sub-light-emitting elements electrically connected to the third sub-pixel circuit part may be positioned at each vertex of a third imaginary triangle, and the three of the fourth sub-light-emitting elements electrically connected to the fourth sub-pixel circuit part may be positioned at each vertex of a fourth imaginary triangle.

The first sub-pixel circuit part may be electrically connected to four of the first sub-light-emitting elements, the second sub-pixel circuit part may be electrically connected to four of the second sub-light-emitting elements, the third sub-pixel circuit part may be electrically connected to four of the third sub-light-emitting elements, and the fourth sub-pixel circuit part may be electrically connected to four of the fourth sub-light-emitting elements.

The four of the first sub-light-emitting elements electrically connected to the first sub-pixel circuit part may be disposed in a first zigzag shape, the four of the second sub-light-emitting elements electrically connected to the second sub-pixel circuit part may be disposed in a second zigzag shape, the four of the third sub-light-emitting elements electrically connected to the third sub-pixel circuit part may be disposed in the first direction, and the four of the fourth sub-light-emitting elements electrically connected to the fourth sub-pixel circuit part may be disposed in the first direction.

The third sub-light-emitting element and the fourth sub-light-emitting element may be electrically connected to each other.

The four of the first sub-light-emitting elements electrically connected to the first sub-pixel circuit part may be disposed in a first zigzag shape, the four of the second sub-light-emitting elements electrically connected to the second sub-pixel circuit part may be disposed in a second zigzag shape, the four of the third sub-light-emitting elements electrically connected to the third sub-pixel circuit part may be disposed at a vertex or side of a first imaginary triangle, or a vertex of a first imaginary quadrangle, and the four of the fourth sub-light-emitting elements electrically connected to the fourth sub-pixel circuit part may be disposed at a vertex or side of a second imaginary triangle, or a vertex of a second imaginary quadrangle.

The four of the first sub-light-emitting elements electrically connected to the first sub-pixel circuit part may be disposed in a first zigzag shape, the four of the second sub-light-emitting elements electrically connected to the second sub-pixel circuit part may be disposed in a second zigzag shape, the four of the third sub-light-emitting elements electrically connected to the third sub-pixel circuit part may be disposed in a third zigzag shape, and the four of the fourth sub-light-emitting elements electrically connected to the fourth sub-pixel circuit part may be disposed in a fourth zigzag shape.

The display device according to an embodiment may further include an extending wire electrically connected between the second pixel circuit part and the second light-emitting elements.

The first and second display areas may form a display area displaying an image, a peripheral area may surround the display area, and the second display area may be disposed between the first display area and the peripheral area.

Part of the driving circuit part may be positioned in the second display area, and other part of the driving circuit part may be positioned in the peripheral area.

According to the embodiments, the display device with the extended display area may be provided.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 9 to FIG. 11 are schematic views showing various connection shapes of second light-emitting elements of a display device according to an embodiment.

FIG. 19 is a schematic view showing a connection shape of second light-emitting elements of a display device according to an embodiment.

FIG. 20 to FIG. 25 are schematic views showing various connection shapes of second light-emitting elements of a display device according to an embodiment.

DETAILED DESCRIPTION OF THE EMBODIMENTS

Figure 1:
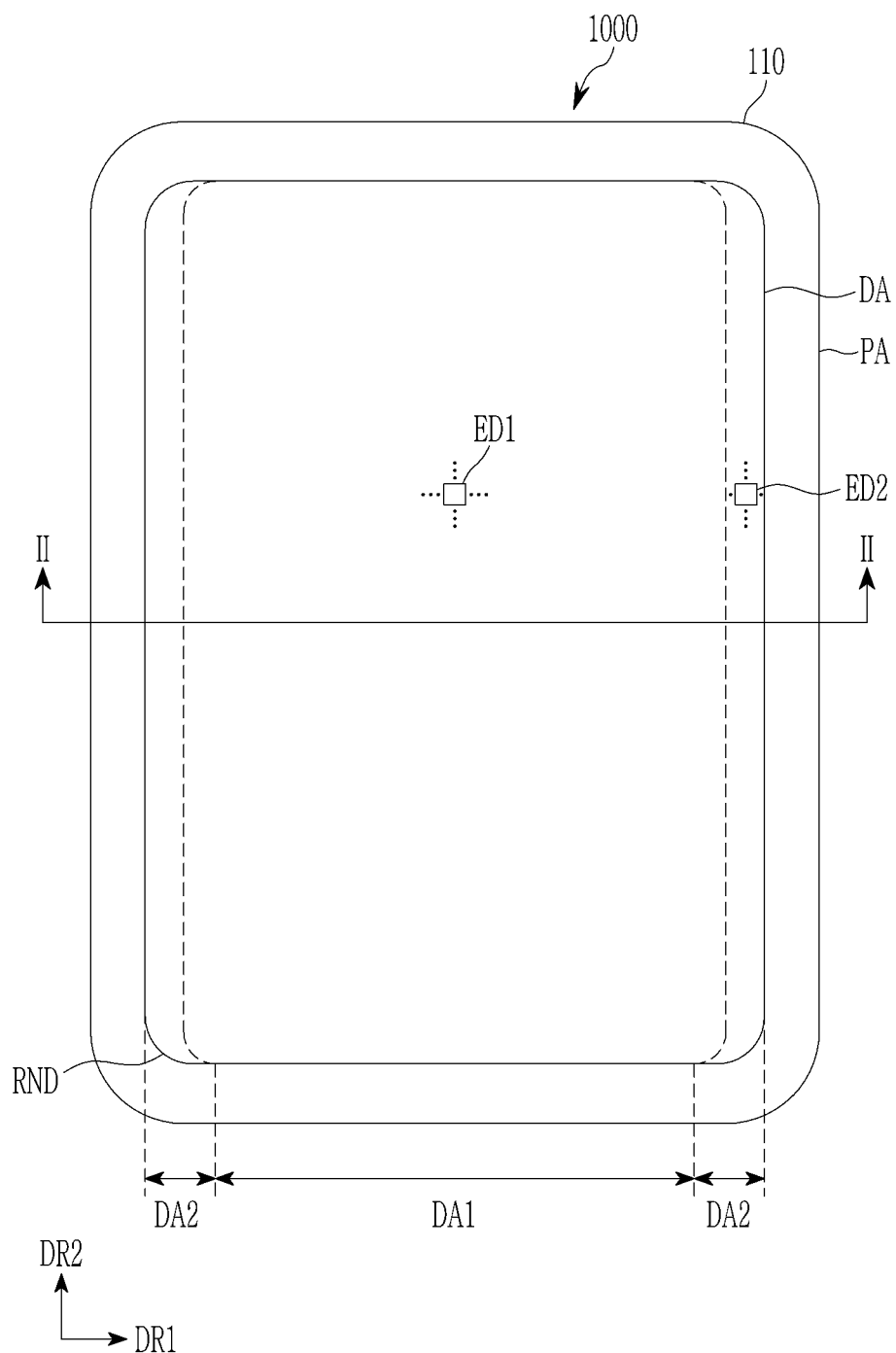
FIG. 1 is a schematic plan view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Descriptions of parts not related to the disclosure are omitted, and like reference numerals designate like elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" or "in a plan view" means when an object portion is viewed from above, and the phrase "on a cross-section" means when a cross-section taken by vertically cutting an object portion is viewed from the side.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

First, a display device according to an embodiment is described with reference to FIGS. 1 and 2.

Figure 2:
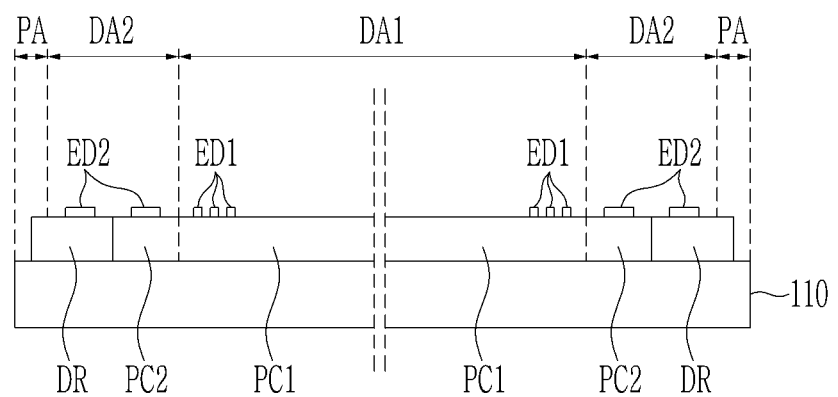
FIG. 2 is a schematic cross-sectional view taken along line II-II of FIG. 1.

FIG. 1 is a schematic plan view of a display device according to an embodiment, and FIG. 2 is a schematic cross-sectional view taken along line II-II of FIG. 1.

As shown in FIGS. 1 and 2, a display device 1000 according to an embodiment includes a substrate 110 and light-emitting elements ED1 and ED2 positioned on the substrate 110.

The substrate 110 includes a display area DA and a peripheral area PA around the display area DA.

The display area DA may be positioned in a center part of the display device 1000 and may have a substantially rectangular shape, and each corner part RND thereof may have a rounded shape. However, the shape of the display area DA and the shape of the corner part are not limited thereto and may be variously changed. The display area DA may include a first display area DA1 and a second display area DA2 adjacent to the first display area DA1. The first display area DA1 may be positioned at a center part of the display area DA, and the second display area DA2 may be positioned on both sides, for example, left and right sides of the first display area DA1. However, this is only an example, and the positions of the first display area DA1 and the second display area DA2 may be variously changed. For example, the first display area DA1 may have a substantially quadrangle shape, and the second display area DA2 may be positioned to surround four corners of the first display area DA1. For example, the second display area DA2 may be positioned to the left, right, upper, and lower sides of the first display area DA1.

The peripheral area PA may have a shape surrounding the display area DA. The peripheral area PA is a region in which no image is displayed, and may be positioned at the periphery of the display device 1000.

At least a portion of the display device 1000 according to an embodiment may include a bent part that is bent. For example, the center part of the display device 1000 may have a flat shape, and an edge part thereof may have a curved shape. In this case, at least part of the second display area DA2 may be positioned on the bending part. For example, at least part of the second display area DA2 of the substrate 110 may have a curved shape.

The light-emitting elements ED1 and ED2 may emit light. For example, the light-emitting elements ED1 and ED2 may emit light such as red, green, and blue, or white light. The display device 1000 may display an image by light emitted from the light-emitting elements ED1 and ED2. The light-emitting elements ED1 and ED2 may include a first light-emitting element ED1 and a second light-emitting element ED2. The light-emitting elements ED1 and ED2 may be positioned in the display area DA. The first light-emitting element ED1 may be positioned in the first display area DA1, and the second light-emitting element ED2 may be positioned in the second display area DA2. Although not illustrated in the drawings, the display device 1000 according to an embodiment may include first light-emitting elements ED1 and second light-emitting elements ED2. First light-emitting elements ED1 in the first display area DA1 may be disposed in the first direction DR1 and the second direction DR2, and second light-emitting elements ED2 in the second display area DA2 may be disposed in the first direction DR1 and the second direction DR2. The size of the first light-emitting element ED1 and the size of the second light-emitting element ED2 may be the same or different. For example, the size of the second light-emitting element ED2 may be larger than the size of the first light-emitting element ED1. The number of first light-emitting elements ED1 per unit area and the number of second light-emitting elements ED2 per unit area may be the same or different. For example, the number of second light-emitting elements ED2 per unit area may be less than the number of first light-emitting elements ED1 per unit area. The resolution of the first display area DA1 and the resolution of the second display area DA2 may be the same or different. For example, the resolution of the first display area DA1 may be higher than that of the second display area DA2. The arrangement shape and size of the first light-emitting element ED1 and the second light-emitting element ED2, and the resolutions of the first display area DA1 and the second display area DA2 are not limited thereto and may be variously changed.

The display device 1000 according to an embodiment may further include pixel circuit parts PC1 and PC2 positioned on the substrate 110. The pixel circuit parts PC1 and PC2 may include a first pixel circuit part PC1 and a second pixel circuit part PC2. The display device 1000 according to an embodiment may include first pixel circuit parts PC1 and second pixel circuit parts PC2. The first pixel circuit part PC1 represents a region in which first pixel circuit parts PC1 are substantially disposed in the first direction DR1 and the second direction DR2, and the second pixel circuit part PC2 represents a region in which second pixel circuit part PC2 are substantially disposed in the first direction DR1 and the second direction DR2. The arrangement shape of pixel circuit parts PC1 and PC2 is not particularly limited and may be arranged in various shapes. The first pixel circuit part PC1 may be positioned in the first display area DA1, and the second pixel circuit part PC2 may be positioned in the second display area DA2. Each of the pixel circuit parts PC1 and PC2 may be electrically connected to at least one light-emitting element ED1 and ED2. The first pixel circuit part PC1 may be electrically connected to the first light-emitting element ED1, and the second pixel circuit part PC2 may be electrically connected to the second light-emitting element ED2. In this case, the second pixel circuit part PC2 may be electrically connected to second light-emitting elements ED2. The size of a first pixel circuit part PC1 and the size of a second pixel circuit part PC2 may be the same or different. For example, the size of a second pixel circuit part PC2 may be larger than the size of a first pixel circuit part PC1. The structure of the first pixel circuit part PC1 and the structure of the second pixel circuit part PC2 may be different.

The display device 1000 according to an embodiment may further include a driving circuit part DR positioned on the substrate 110. The driving circuit part DR may be electrically connected to the first pixel circuit part PC1 and the second pixel circuit part PC2. The driving circuit part DR may include driving parts and signal wires. For example, the driving circuit part DR may include a scan driver, a data driver, a driving voltage supply line, a common voltage supply line, and signal transmitting wires electrically connected to them. The scan driver generates a scan signal and transmits it to the pixel circuit parts PC1 and PC2 through the scan line. The data driver generates a data signal and transmits it to the pixel circuit parts PC1 and PC2 via the data line. The driving voltage supply line transmits a driving voltage to the pixel circuit parts PC1 and PC2. The common voltage supply line transmits a common voltage to an electrode of the light-emitting elements ED1 and ED2. At least part of the driving circuit part DR may be positioned in the second display area DA2, and the remaining part may be positioned in the peripheral area PA.

In the first display area DA1, the first pixel circuit part PC1 may be electrically connected to the first light-emitting element ED1 disposed on the first pixel circuit part PC1. In this case, a light-emitting region of the first light-emitting element ED1 may overlap the first pixel circuit part PC1 electrically connected thereto. The first display area DA1 is a region where light is emitted by the first light-emitting element ED1.

In the second display area DA2, the second pixel circuit part PC2 may be electrically connected to the second light-emitting elements ED2 spaced apart from each other by a predetermined interval. In this case, a light-emitting region of the second light-emitting element ED2 may not overlap the second pixel circuit part PC2 electrically connected thereto. The light-emitting region of the second light-emitting element ED2 may overlap the second pixel circuit part PC2 that is not electrically connected thereto. The light-emitting region of the second light-emitting element ED2 may also overlap the driving circuit part DR. The light-emitting regions of some second light-emitting elements ED2 may overlap the second pixel circuit parts PC2 electrically connected thereto. The second display area DA2 is a region where light is emitted by the second light-emitting element ED2.

In a typical display device, a pixel circuit part and a light-emitting element are positioned in a display area, but a driving circuit part may be positioned in a peripheral area, and the pixel circuit part and the light-emitting element may not be positioned in the peripheral area surrounding the display area. Accordingly, no light is emitted from the peripheral area where the driving circuit part is positioned, and a dead space is formed. In the display device 1000 according to an embodiment, the second light-emitting element ED2 is positioned at a portion where the driving circuit part DR is positioned, to emit light, so that a region in which the image is displayed may be expanded. For example, by positioning the second light-emitting element ED2 on the driving circuit part DR, a dead space may be reduced, and a bezel size may be reduced.

The connection relationship between each pixel circuit part and each light-emitting element of the display device according to an embodiment is described with reference to FIGS. 3 and 4.

Figure 3:
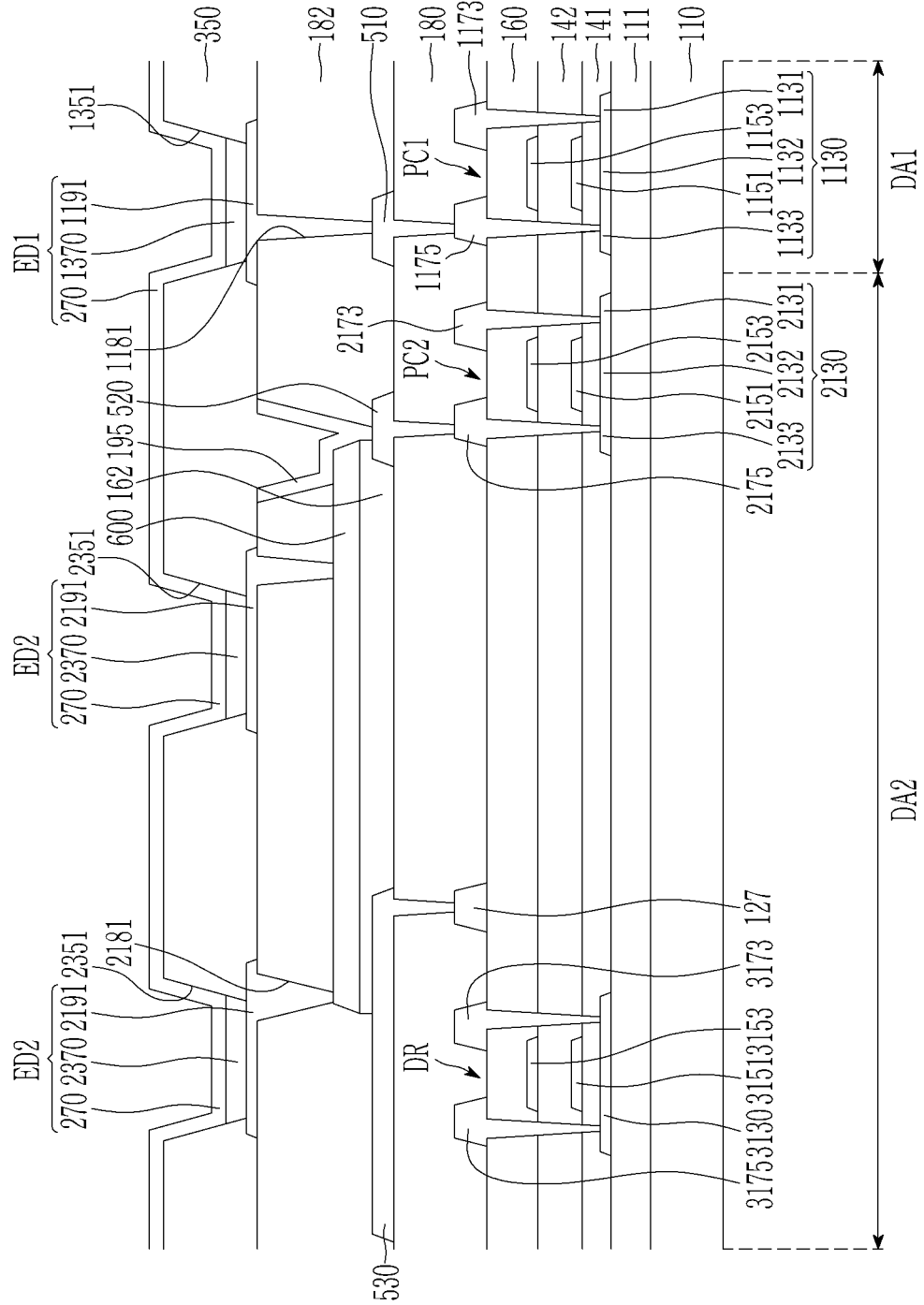
FIG. 3 is a schematic cross-sectional view showing a part of a display device according to an embodiment.
Figure 4:
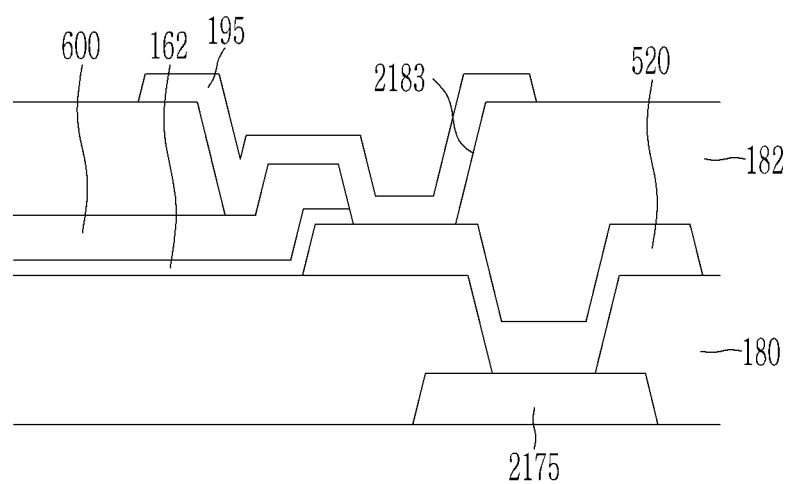
FIG. 4 is a schematic enlarged cross-sectional view showing some layers of a partial region of FIG. 3.

FIG. 3 is a schematic cross-sectional view illustrating a portion of a display device according to an embodiment, and FIG. 4 is a schematic enlarged cross-sectional view illustrating some layers of a partial region of FIG. 3.

First, as shown in FIG. 3, the light-emitting region of the first light-emitting element ED1 of the display device according to an embodiment may overlap the first pixel circuit part PC1 electrically connected to the first light-emitting element ED1.

The first pixel circuit part PC1 may include a semiconductor 1130, a gate electrode 1151, a source electrode 1173, and a drain electrode 1175 positioned in the first display area DA1 on the substrate 110.

The substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material that may be bent or folded, and may be single-layered or multi-layered.

A buffer layer 111 may be positioned on the substrate 110. The buffer layer 111 may have a single-layered or multi-layered structure. The buffer layer 111 may include an inorganic insulating material or an organic insulating material such as a silicon nitride ($SiN_x$), a silicon oxide ($SiO_x$), or a silicon oxynitride ($SiO_xN_y$). The buffer layer 111 may be omitted in some embodiments. A barrier layer may be further positioned between the substrate 110 and the buffer layer 111. The barrier layer may have a single-layered or multi-layered structure. The barrier layer may include an inorganic insulating material such as a silicon nitride ($SiN_x$), a silicon oxide ($SiO_x$), or a silicon oxynitride ($SiO_xN_y$).

A semiconductor layer including the semiconductor 1130 of the first pixel circuit part PC1 may be positioned on the buffer layer 111. The semiconductor 1130 may include a first region 1131, a channel 1132, and a second region 1133. The first region 1131 and the second region 1133 may be respectively positioned on both sides of the channel 1132 of the semiconductor 1130 of the first pixel circuit part PC1. The semiconductor 1130 of the first pixel circuit part PC1 may include a semiconductor material such as amorphous silicon, polysilicon, or an oxide semiconductor.

A first gate insulating layer 141 may be positioned on the semiconductor 1130 of the first pixel circuit part PC1. The first gate insulating layer 141 may have a single-layered or multi-layered structure. The first gate insulating layer 141 may include an inorganic insulating material such as a silicon nitride ($SiN_x$), a silicon oxide ($SiO_x$), or a silicon oxynitride ($SiO_xN_y$).

On the first gate insulating layer 141, a first gate conductive layer including a gate electrode 1151 of the first pixel circuit part PC1 may be positioned. The gate electrode 1151 of the first pixel circuit part PC1 may overlap the channel 1132 of the semiconductor 1130. The first gate conductive layer may have a single-layered or multi-layered structure. The first gate conductive layer may include a metal such as molybdenum (Mo), aluminum (Al), copper (Cu), and/or titanium (Ti). After forming the first gate conductive layer, a doping process or plasma treatment may be performed. The part of the semiconductor layer covered by (or overlapped by or overlapping) the first gate conductive layer is not doped or plasma treated, and the part of the semiconductor layer not covered by the first gate conductive layer is doped or plasma treated, so it may have the same characteristics as the conductor.

A second gate insulating layer 142 may be positioned on the first gate conductive layer including the gate electrode 1151 of the first pixel circuit part PC1. The second gate insulating layer 142 may have a single-layered or multi-layered structure. The second gate insulating layer 142 may include an inorganic insulating material such as a silicon nitride ($SiN_x$), a silicon oxide ($SiO_x$), or a silicon oxynitride ($SiO_xN_y$).

A second gate conductive layer including a first storage electrode 1153 may be positioned on the second gate insulating layer 142. The second gate conductive layer may have a single-layered or multi-layered structure. The second gate conductive layer may include a metal such as molybdenum (Mo), aluminum (Al), copper (Cu), and/or titanium (Ti). The first storage electrode 1153 overlaps the gate electrode 1151 to form a storage capacitor.

A first interlayer insulating layer 160 may be positioned on the second gate conductive layer including the first storage electrode 1153. The first interlayer insulating layer 160 may have a single-layered or multi-layered structure. The first interlayer insulating layer 160 may include an inorganic insulating material or an organic insulating material.

A first data conductive layer including a source electrode 1173 and a drain electrode 1175 of the first pixel circuit unit PC1 may be positioned on the first interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first interlayer insulating layer 160 may include an opening overlapping the source electrode 1173 of the first pixel circuit part PC1 and the first region 1131 of the semiconductor 1130. The source electrode 1173 of the first pixel circuit part PC1 may be electrically connected to the first region 1131 of the semiconductor 1130 through the opening. The first interlayer insulating layer 160 may include an opening overlapping the drain electrode 1175 of the first pixel circuit part PC1 and the second region 1133 of the semiconductor 1130. The drain electrode 1175 of the first pixel circuit part PC1 may be electrically connected to the second region 1133 of the semiconductor 1130 through the opening.

A first passivation layer 180 may be positioned on the first data conductive layer including the source electrode 1173 and the drain electrode 1175 of the first pixel circuit part PC1. The first passivation layer 180 may include an inorganic insulating material such as a silicon nitride ($SiN_x$), a silicon oxide ($SiO_x$), and a silicon oxynitride ($SiO_xN_y$) and/or an organic insulating material such as a polyimide, an acryl-based polymer, and a siloxane-based polymer.

A second data conductive layer including a connection electrode 510 of the first pixel circuit part PC1 may be positioned on the first passivation layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first passivation layer 180 may include an opening overlapping the drain electrode 1175 of the first pixel circuit part PC1. The connection electrode 510 of the first pixel circuit part PC1 may be electrically connected to the drain electrode 1175 through the opening.

A second passivation layer 182 may be positioned on the second data conductive layer including the connection electrode 510 of the first pixel circuit part PC1. The second passivation layer 182 may include an insulating material such as a general-purpose polymer such as polymethyl methacrylate (PMMA) or polystyrene (PS), a polymer derivative having a phenolic group, an acryl-based polymer, an imide-based polymer, a polyimide, an acryl-based polymer, or an organic polymer such as a siloxane-based polymer.

The first light-emitting element ED1 electrically connected to the first pixel circuit part PC1 may be positioned on the second passivation layer 182. The first light-emitting element ED1 may include a pixel electrode 1191, an emission layer 1370, and a common electrode 270.

The pixel electrode 1191 of the first light-emitting element ED1 may be positioned on the second passivation layer 182. The second passivation layer 182 may include an opening 1181 overlapping the pixel electrode 1191 of the first light-emitting element ED1 and the connection electrode 510 of the first pixel circuit part PC1. The pixel electrode 1191 of the first light-emitting element ED1 may be electrically connected to the connection electrode 510 of the first pixel circuit part PC1 through the opening 1181. Accordingly, the pixel electrode 1191 of the first light-emitting element ED1 may be electrically connected to the drain electrode 1175 of the first pixel circuit part PC1 through the connection electrode 510.

A partition wall 350 may be positioned on the pixel electrode 1191 of the first light-emitting element ED1. A pixel opening 1351 is formed in the partition wall 350, and the pixel opening 1351 of the partition wall 350 may overlap the pixel electrode 1191.

In the pixel opening 1351 of the partition wall 350, the emission layer 1370 of the first light-emitting element ED1 may be positioned. The emission layer 1370 may overlap the pixel electrode 1191.

A common electrode 270 may be positioned on the emission layer 1370 and the partition wall 350.

The first light-emitting element ED1 emits light around the region where the pixel electrode 1191, the emission layer 1370, and the common electrode 270 overlap each other, and the light-emitting region of the first light-emitting element ED1 may overlap the first pixel circuit part PC1 electrically connected thereto.

In this case, each first light-emitting element ED1 may display at least one of a first color, a second color, and a third color. For example, the first light-emitting element ED1 may display red (R), green (G), and blue (B).

The light-emitting region of the second light-emitting element ED2 of the display device according to an embodiment may or may not overlap the second pixel circuit part PC2 electrically connected to the second light-emitting element ED2. Part of second light-emitting elements ED2 may overlap the second pixel circuit part PC2 electrically connected to the second light-emitting element ED2. Other part of second light-emitting elements ED2 may overlap the driving circuit part DR.

The second pixel circuit part PC2 may include a semiconductor 2130, a gate electrode 2151, a source electrode 2173, and a drain electrode 2175 positioned on the second display area DA2 of the substrate 110. The driving circuit part DR may include a semiconductor 3130, a gate electrode 3151, a source electrode 3173, and a drain electrode 3175 positioned on the second display area DA2 of the substrate 110.

The buffer layer 111 may be positioned on the substrate 110, and the semiconductor 2130 of the second pixel circuit part PC2 and the semiconductor 3130 of the driving circuit part DR may be positioned on the buffer layer 111. The semiconductor 2130 of the second pixel circuit part PC2 and the semiconductor 3130 of the driving circuit part DR may be positioned in the semiconductor layer. The semiconductor 2130 of the second pixel circuit part PC2 may include a first region 2131, a channel 2132, and a second region 2133.

The first gate insulating layer 141 may be positioned on the semiconductor 2130 of the second pixel circuit part PC2 and the semiconductor 3130 of the driving circuit part DR, and the gate electrode 2151 of the second pixel circuit part PC2 and the gate electrode 3151 of the driving circuit part DR may be positioned on the first gate insulating layer 141. The gate electrode 2151 of the second pixel circuit part PC2 and the gate electrode 3151 of the driving circuit part DR may be positioned on the first gate conductive layer. The gate electrode 2151 of the second pixel circuit part PC2 may overlap the channel 2132 of the semiconductor 2130.

The second gate insulating layer 142 may be positioned on the gate electrode 2151 of the second pixel circuit part PC2 and the gate electrode 3151 of the driving circuit part DR, and a first storage electrode 2153 of the second pixel circuit part PC2 and a first storage electrode 3153 of the driving circuit part DR may be positioned on the second gate insulating layer 142. The first storage electrode 2153 of the second pixel circuit part PC2 may overlap the gate electrode 2151 of the second pixel circuit part PC2. The first storage electrode 3153 of the driving circuit part DR may overlap the gate electrode 3151 of the driving circuit part DR.

The first interlayer insulating layer 160 may be positioned on the first storage electrode 2153 of the second pixel circuit part PC2 and the first storage electrode 3153 of the driving circuit part DR. On the first interlayer insulating layer 160, the source electrode 2173 and the drain electrode 2175 of the second pixel circuit part PC2 and the source electrode 3173 and the drain electrode 3175 of the driving circuit part DR may be positioned. The source electrode 2173 and the drain electrode 2175 of the second pixel circuit part PC2 and the source electrode 3173 and the drain electrode 3175 of the driving circuit part DR may be positioned in the first data conductive layer.

The first interlayer insulating layer 160 may include an opening overlapping the source electrode 2173 of the second pixel circuit part PC2 and the first region 2131 of the semiconductor 2130. The source electrode 2173 of the second pixel circuit part PC2 may be electrically connected to the first region 2131 of the semiconductor 2130 through the opening. The first interlayer insulating layer 160 may include an opening overlapping the drain electrode 2175 of the second pixel circuit part PC2 and the second region 2133 of the semiconductor 2130. The drain electrode 2175 of the second pixel circuit part PC2 may be electrically connected to the second region 2133 of the semiconductor 2130 through the opening. Similarly, the source electrode 3173 of the driving circuit part DR may be electrically connected to a first region of the semiconductor 3130, and the drain electrode 3175 may be electrically connected to a second region of the semiconductor 3130.

The first data conductive layer may further include an initialization voltage line 127. The initialization voltage line 127 may transmit an initialization voltage Vint. The initialization voltage Vint is formed as a constant voltage. For example, a constant voltage is applied to the initialization voltage line 127.

The first passivation layer 180 may be positioned on the source electrode 2173 and the drain electrode 2175 of the second pixel circuit part PC2 and the source electrode 3173 and the drain electrode 3175 of the driving circuit part DR.

A connection electrode 520 of the second pixel circuit part PC2 may be positioned on the first passivation layer 180. The connection electrode 520 of the second pixel circuit part PC2 may be positioned in the second data conductive layer. The first passivation layer 180 may include an opening overlapping the drain electrode 2175 of the second pixel circuit part PC2. The connection electrode 520 of the second pixel circuit part PC2 may be electrically connected to the drain electrode 2175 through the opening.

The second data conductive layer may further include a shielding electrode 530. The first passivation layer 180 may include an opening overlapping the initialization voltage line 127. The shielding electrode 530 may be electrically connected to the initialization voltage line 127 through the opening. The shielding electrode 530 may overlap the driving circuit part DR and may cover the driving circuit part DR. The shielding electrode 530 may receive the initialization voltage Vint through the initialization voltage line 127.

The shielding electrode 530 may be positioned between the driving circuit part DR and the second light-emitting element ED2. The second light-emitting element ED2 may overlap the driving circuit part DR and may be affected by a voltage applied to the driving circuit part DR. In the display device according to an embodiment, the effect of the driving circuit part DR on the second light-emitting element ED2 may be shielded by the shielding electrode 530 to which a constant voltage such as the initialization voltage Vint is applied. It has been described above that the shielding electrode 530 is electrically connected to the initialization voltage line 127, but the disclosure is not limited thereto. The shielding electrode 530 may be electrically connected to other wiring, and a constant voltage may be applied to the shielding electrode 530. For example, the shielding electrode 530 may be electrically connected to a wire to which a common voltage ELVSS is applied.

A second interlayer insulating layer 162 may be positioned on the connection electrode 520 of the second pixel circuit part PC2. Part of the connection electrode 520 of the second pixel circuit part PC2 may be covered by the second interlayer insulating layer 162, and other part of the connection electrode 520 of the second pixel circuit part PC2 may be covered by the second passivation layer 182.

An extending wire 600 may be positioned on the second interlayer insulating layer 162. The extending wire 600 may be electrically connected to the connection electrode 520 of the second pixel circuit part PC2, and their connection relationship will be further described with reference to FIG. 4. The extending wire 600 and the second interlayer insulating layer 162 may be patterned simultaneously using a same mask. Accordingly, the extending wire 600 and the second interlayer insulating layer 162 may have substantially a same planar shape. The extending wire 600 may be positioned only in the second display area DA2 and may not be positioned in the first display area DA1. The second interlayer insulating layer 162 may also be positioned only in the second display area DA2 and may not be positioned in the first display area DA1. Accordingly, the second interlayer insulating layer 162 may at least partially overlap the second pixel circuit part PC2 and the second light-emitting element ED2, and may not overlap the first pixel circuit part PC1 and the first light-emitting element ED1 at all. By simultaneously patterning both the extending wire 600 and the second interlayer insulating layer 162, the number of masks used in a process of manufacturing the display device according to an embodiment may be reduced.

Accordingly, it is possible to reduce process cost, time, and the like. The extending wire 600 may overlap part of the edge of the connection electrode 520 of the second pixel circuit part PC2. The second interlayer insulating layer 162 is positioned between the extending wire 600 and the connection electrode 520 of the second pixel circuit part PC2, and the extending wire 600 and the connection electrode 520 of the second pixel circuit part PC2 are not directly electrically connected to each other. The extending wire 600 may also overlap the shielding electrode 530. The second interlayer insulating layer 162 is positioned between the extending wire 600 and the shielding electrode 530. The extending wire 600 and the shielding electrode 530 may be insulated from each other by the second interlayer insulating layer 162.

A second passivation layer 182 is positioned on the connection electrode 520 of the second pixel circuit part PC2 and the extending wire 600. The second passivation layer 182 includes an opening 2183 overlapping an overlapping portion of the connection electrode 520 of the second pixel circuit part PC2 and the extending wire 600, and the periphery thereof. A bridge electrode 195 may be positioned on the second passivation layer 182. The bridge electrode 195 and the pixel electrode 1191 of the first light-emitting element ED1 may be positioned on a same layer. The bridge electrode 195 is positioned within the opening 2183 and may be electrically connected to the connection electrode 520 of the second pixel circuit part PC2 and the extending wire 600 within the opening 2183. Accordingly, the extending wire 600 and the connection electrode 520 of the second pixel circuit part PC2 may be electrically connected by the bridge electrode 195.

Second light-emitting elements ED2 electrically connected to the second pixel circuit part PC2 may be positioned on the second passivation layer 182. For example, the second pixel circuit part PC2 may be electrically connected to the two second light-emitting elements ED2. However, the number of the second light-emitting elements ED2 electrically connected to the second pixel circuit part PC2 is not limited thereto, and the second pixel circuit part PC2 may be electrically connected to three or more second light-emitting elements ED2. Each second light-emitting element ED2 may include a pixel electrode 2191, an emission layer 2370, and a common electrode 270.

The pixel electrode 2191 of each second light-emitting element ED2 may be positioned on the second passivation layer 182. The pixel electrode 2191 of the second light-emitting element ED2, the pixel electrode 1191, and the bridge electrode 195 of the first light-emitting element ED1 may be positioned on a same layer. The second passivation layer 182 may include an opening 2181 overlapping the pixel electrode 2191 of the second light-emitting element ED2 and the extending wire 600. The pixel electrode 2191 of each second light-emitting element ED2 may be electrically connected to the extending wire 600 through the opening 2181. The extending wire 600 may be electrically connected to the second pixel circuit part PC2 through the bridge electrode 195. Accordingly, the extending wire 600 may electrically connect the second pixel circuit part PC2 to second light-emitting element ED2. At least some of second light-emitting elements ED2 may be spaced apart from the second pixel circuit part PC2 electrically connected to the second light-emitting element ED2 without overlapping the second pixel circuit part PC2. The extending wire 600 may electrically connect second light-emitting elements ED2 and the second pixel circuit part PC2, which are spaced apart from each other.

It has been described above that the second pixel circuit part PC2 and the second light-emitting element ED2 are electrically connected to each other by the extending wire 600, but the disclosure is not limited thereto. In some embodiments, the extending wire 600 may be omitted, and the pixel electrode 2191 of the second light-emitting element ED2 may be extended to be electrically connected to the second pixel circuit part PC2 that is far away therefrom. In this case, the pixel electrode 2191 of second light-emitting elements ED2 may be formed to extend long and may be bypassed so as to not collide with an adjacent pixel to be electrically connected to a second pixel circuit part PC2. However, in the structure in which the extending wire 600 is omitted, a process of extending the pixel electrode 2191 may be complicated, and thus a short-circuit defect may occur. In the structure in which the extending wire 600 is formed, the design of the wiring may be simplified, and the short-circuited defect may be prevented by positioning the extending wire 600 on a different layer from the pixel electrode 2191 of the second light-emitting element ED2.

A partition wall 350 may be positioned on the pixel electrode 2191 of the second light-emitting element ED2. A pixel opening 2351 is formed in the partition wall 350, and the pixel opening 2351 of the partition wall 350 may overlap the pixel electrode 2191.

In the pixel opening 2351 of the partition wall 350, the emission layer 2370 of the second light-emitting element ED2 may be positioned. The emission layer 2370 may overlap the pixel electrode 2191.

A common electrode 270 may be positioned on the emission layer 2370 and the partition wall 350. The common electrode 270 of the second light-emitting element ED2 and the common electrode 270 of the first light-emitting element ED1 may be integrally formed (or integral with each other) and may be entirely positioned in most regions on the substrate 110.

The second light-emitting element ED2 emits light around the region where the pixel electrode 2191, the emission layer 2370, and the common electrode 270 overlap each other, and the light-emitting region of the second light-emitting element ED2 may or may not overlap the second pixel circuit part PC2 electrically connected thereto.

In the display device according to an embodiment, the second light-emitting element ED2 is positioned not only in the region in which the second pixel circuit part PC2 is positioned but also in the region in which the driving circuit part DR is positioned, so that the region in which the image is displayed may be expanded. Accordingly, the pixel density in the second display area DA2 may be relatively lower than the pixel density in the first display area DA1. In this case, the size of the second light-emitting element ED2 may be increased in order to increase the luminance of the second light-emitting element ED2 for compensating for the decreased pixel density. Accordingly, in order to supply more current to the second light-emitting element ED2, the size of each element such as a storage capacitor included in the second pixel circuit part PC2 may be formed to be large. For example, the area occupied by the second pixel circuit part PC2 may be widened. For example, the area of the second pixel circuit part PC2 may be about twice the area of the first pixel circuit part PC1. In this case, the area of the second light-emitting element ED2 may be about twice the area of the first light-emitting element ED1. However, this is only an example, and the areas of the second pixel circuit part PC2 and the second light-emitting element ED2 may be set in various ways.

By electrically connecting second light-emitting elements ED2 to a second pixel circuit part PC2, the resolution of the second display area DA2 can be substantially increased. For example, the resolution of the second display area DA2 may be similar to that of the first display area DA1.

Although a transistor of each of the pixel circuit parts PC1 and PC2 has been described above, each of the pixel circuit parts PC1 and PC2 may include transistors. Hereinafter, an example of a pixel of the display device according to an embodiment will be described with reference to FIG. 5.

Figure 5:
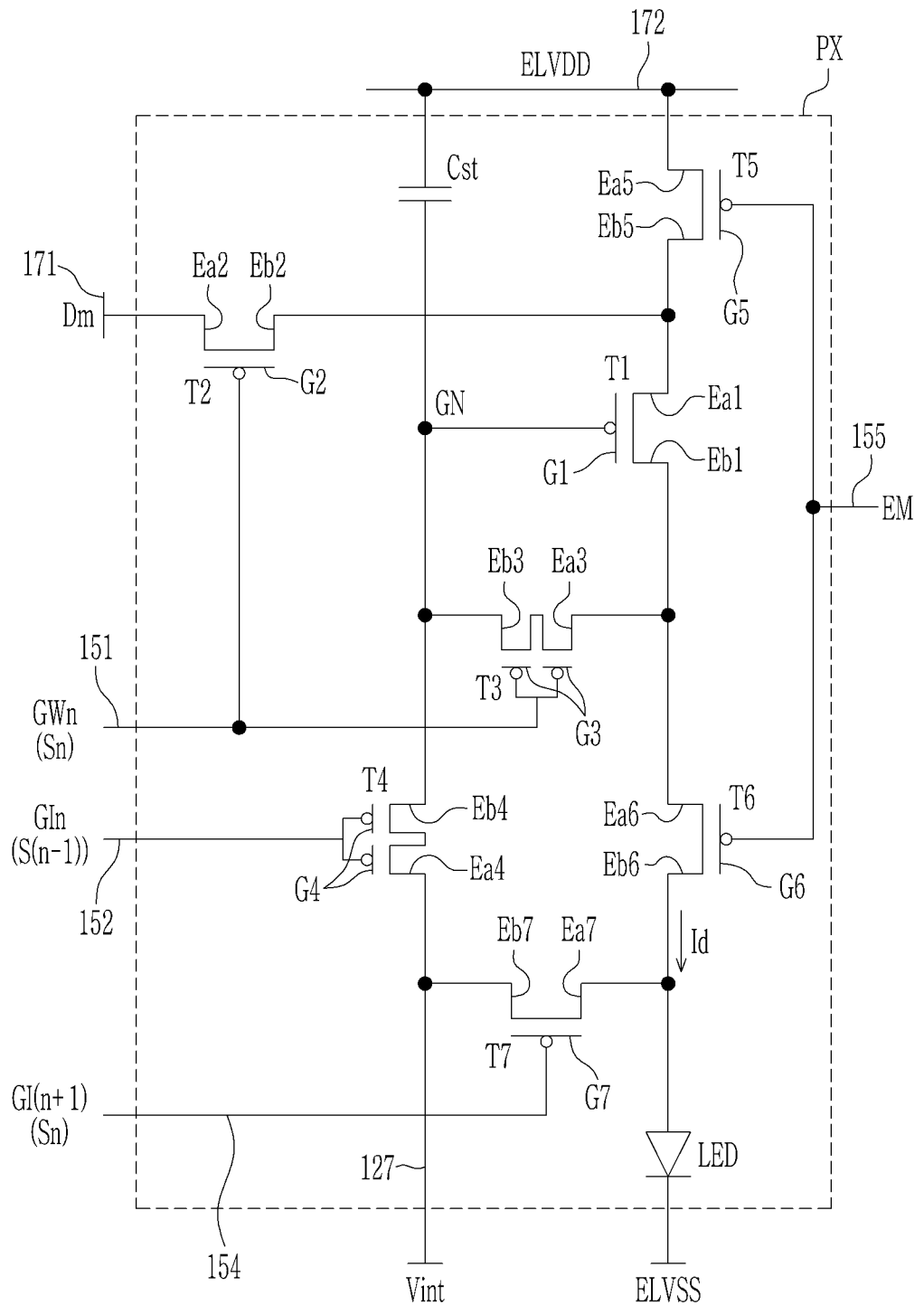
FIG. 5 is a schematic diagram of an equivalent circuit one pixel of a display device according to an embodiment.

FIG. 5 is a schematic diagram of an equivalent circuit of a pixel of a display device according to an embodiment.

As shown in FIG. 5, a display device according to an embodiment includes pixels PX capable of displaying an image and signal lines 127, 151, 152, 154, 155, 171, and 172. A pixel PX may include transistors T1, T2, T3, T4, T5, T6, and T7, a capacitor Cst, and at least one light-emitting element LED which are electrically connected to signal lines 127, 151, 152, 154, 155, 171, and 172. FIG. 5 illustrates that a pixel PX includes a light-emitting element LED. Each pixel PX positioned in the first display area DA1 may include a light-emitting element LED, and each pixel PX positioned in the second display area DA2 may include light-emitting elements LED. A driving current Id is divided and supplied to light-emitting elements LED positioned in each pixel PX of the second display area DA2. Second light-emitting elements ED2 are electrically connected to each other and may have a same luminance by receiving a same signal.

The signal lines 127, 151, 152, 154, 155, 171, and 172 may include an initialization voltage line 127, scan lines 151, 152, and 154, a light emission control line 155, a data line 171, and a driving voltage line 172.

The initialization voltage line 127 may transmit the initialization voltage Vint. Scan lines 151, 152, and 154 may transmit scan signals GWn, GIn, and GI(n+1), respectively. The scan signals GWn, GIn, and GI(n+1) may be transmitted as a gate-on voltage and a gate-off voltage capable of turning on or off the transistors T2, T3, T4, and T7 included in the pixel PX.

The scan lines 151, 152, and 154 electrically connected to a pixel PX may include a first scan line 151 capable of transmitting a scan signal GWn, a second scan line 152 capable of transmitting a scan signal GIn having a gate-on voltage at a different timing from that of the first scan line 151, and a third scan line 154 capable of transmitting a scan signal GI(n+1). In the embodiment, an example in which the second scan line 152 transmits a gate-on voltage at an earlier timing than that of the first scan line 151 is mainly described. For example, in case that the scan signal GWn is an n-th scan signal Sn (where n is a natural number greater than or equal to 1) among the scan signals applied during a frame, the scan signal GIn may be a previous scan signal such as an (n−1)-th scan signal S(n−1), and the scan signal GI(n+1) may be a n-th scan signal Sn. However, the embodiment is not limited thereto, and the scan signal GI(n+1) may be a different scan signal from the n-th scan signal Sn.

The light emission control line 155 may transmit a control signal, and particularly, may transmit a light emission control signal EM capable of controlling light emission of the light emitting diode LED included in the pixel PX. The control signal transmitted by the light emission control line 155 may transmit a gate-on voltage and a gate-off voltage and may have a different waveform from that of a scan signal transmitted by the scan lines 151, 152, and 154.

The data line 171 may transmit a data signal Dm, and the driving voltage line 172 may transmit a driving voltage ELVDD. The data signal Dm may have a different voltage level according to an image signal input to the display device, and the driving voltage ELVDD may have a substantially constant level.

Although not shown in the drawings, the display device may further include a driving circuit part that transmits signals to signal lines 127, 151, 152, 154, 155, 171, and 172.

Transistors T1, T2, T3, T4, T5, T6, and T7 included in a pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

A gate electrode G1 of the first transistor T1 is electrically connected to one terminal (or first terminal) of the capacitor Cst by a driving gate node GN, a first electrode Ea1 of the first transistor T1 is electrically connected to the driving voltage line 172 via the fifth transistor T5, and a second electrode Eb1 of the first transistor T1 is electrically connected to an anode of the light emitting diode LED via the sixth transistor T6. The first transistor T1 may receive the data signal Dm transmitted by the data line 171 depending on the switching operation of the second transistor T2 to supply the driving current Id to the light emitting diode LED.

A gate electrode G2 of the second transistor T2 is electrically connected to the first scan line 151, a first electrode Ea2 of the second transistor T2 is electrically connected to the data line 171, and a second electrode Eb2 of the second transistor T2 is electrically connected to the first electrode Ea1 of the first transistor T1 and is electrically connected to the driving voltage line 172 via the fifth transistor T5. The second transistor T2 is turned on depending on the scan signal GWn transmitted through the first scan line 151, thereby transmitting the data signal Dm transmitted from the data line 171 to the first electrode Ea1 of the first transistor T1.

A gate electrode G3 of the third transistor T3 is electrically connected to the first scan line 151, and a first electrode Ea3 of the third transistor T3 is electrically connected to the second electrode Eb1 of the first transistor T1 and is electrically connected to the anode of the light emitting diode LED via the sixth transistor T6. A second electrode Eb3 of the third transistor T3 is electrically connected to a second electrode Eb4 of the fourth transistor T4, one terminal of the capacitor Cst, and the gate electrode G1 of the first transistor T1. The third transistor T3 is turned on depending on the scan signal GWn transmitted through the first scan line 151 to electrically connect the gate electrode G1 and the second electrode Eb1 of the first transistor T1 to each other, thereby diode-connecting the first transistor T1.

A gate electrode G4 of the fourth transistor T4 is electrically connected to the second scan line 152, a first electrode Ea4 of the fourth transistor T4 is electrically connected to an initialization voltage Vint terminal, and the second electrode Eb4 of the fourth transistor T4 is electrically connected to one terminal of the capacitor Cst and the gate electrode G1 of the first transistor T1 through the second electrode Eb3 of the third transistor T3. The fourth transistor T4 is turned on depending on the scan signal Gin transmitted through the second scan line 152 to transmit the initialization voltage Vint to the gate electrode G1 of the first transistor T1, thereby performing an initialization step of initializing the voltage of the gate electrode G1 of the first transistor T1.

A gate electrode G5 of the fifth transistor T5 is electrically connected to the light emission control line 155, a first electrode Ea5 of the fifth transistor T5 is electrically connected to the driving voltage line 172, and a second electrode Eb5 of the fifth transistor T5 is electrically connected to the first electrode Ea1 of the first transistor T1 and the second electrode Eb2 of the second transistor T2.

A gate electrode G6 of the sixth transistor T6 is electrically connected to the light emission control line 155, a first electrode Ea6 of the sixth transistor T6 is electrically connected to the second electrode Eb1 of the first transistor T1 and the first electrode Ea3 of the third transistor T3, and a second electrode Eb6 of the sixth transistor T6 is electrically connected to the anode of the light emitting diode LED. Both the fifth transistor T5 and the sixth transistor T6 are turned on depending on the light emission control signal EM transmitted through the light emission control line 155, thereby transmitting the driving voltage ELVDD to the light emitting diode LED through the diode-connected first transistor T1.

A gate electrode G7 of the seventh transistor T7 is electrically connected to the third scan line 154, a first electrode Ea7 of the seventh transistor T7 is electrically connected to the second electrode Eb6 of the sixth transistor T6 and the anode of the light emitting diode LED, and a second electrode Eb7 of the seventh transistor T7 is electrically connected to the initialization voltage Vint terminal and the first electrode Ea4 of the fourth transistor T4.

The transistors T1, T2, T3, T4, T5, T6, and T7 may each be a P-type channel transistor such as a P-channel metal oxide semiconductor (PMOS), however, they are not limited thereto, and at least one among the transistors T1, T2, T3, T4, T5, T6, and T7 may be an N-type channel transistor.

As above-described, one terminal (or first terminal) of the capacitor Cst is electrically connected to the gate electrode G1 of the first transistor T1 and the other terminal (or second terminal) thereof is electrically connected to the driving voltage line 172. A cathode of the light emitting diode LED is electrically connected to a common voltage ELVSS terminal transmitting the common voltage ELVSS, thereby receiving the common voltage ELVSS.

The pixel positioned in the first display area DA1 and the pixel positioned in the second display area DA2 may both have the circuit diagram structure of the pixel shown in FIG. 5 as above-described. However, the disclosure is not limited thereto, and the circuit diagram of the pixel positioned in the first display area DA1 and the circuit diagram of the pixel positioned in the second display area DA2 may be different. The circuit diagram of the pixel shown in FIG. 5 is only an example, and the numbers of the transistors and the capacitors included in a pixel PX of the display device according to an embodiment, and the connection relationship therebetween may be variously changed.

In the display device according to an embodiment, each first pixel circuit part PC1 may be electrically connected to a first light-emitting element ED1, and each second pixel circuit part PC2 may be electrically connected to second light-emitting elements ED2. In this case, the first light-emitting element ED1 and the second light-emitting element ED2 may be disposed in various shapes. Hereinafter, an arrangement shape of the first pixel circuit part PC1 and the first light-emitting element ED1, an arrangement shape of the second pixel circuit part PC2 and the second light-emitting element ED2, and a connection shape of second light-emitting elements ED2, etc. are described.

First, the arrangement shape of the first pixel circuit part PC1 and the first light-emitting element ED1 will be described as follows with reference to FIG. 6.

Figure 6:
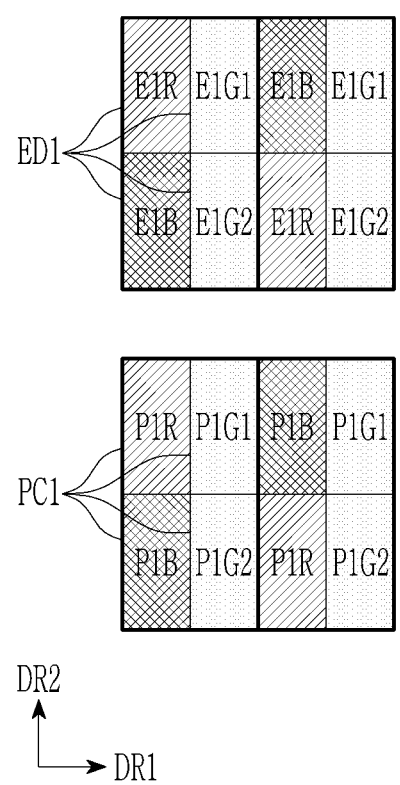
FIG. 6 is a schematic view respectively showing an arrangement shape of a first pixel circuit unit and an arrangement shape of a first light-emitting element in a display device according to an embodiment.

FIG. 6 is a schematic view respectively illustrating an arrangement shape of a first pixel circuit part and an arrangement shape of a first light-emitting element in a display device according to an embodiment. For explanation, although FIG. 6 illustrates that the first pixel circuit part PC1 and the first light-emitting element ED1 are separated from each other, the first pixel circuit part PC1 may overlap the first light-emitting element ED1.

As shown in FIG. 6, first light-emitting elements ED1 may be disposed in a first direction DR1 and a second direction DR2 on the first display area of the substrate of the display device according to an embodiment. The second direction DR2 may be a direction perpendicular to the first direction DR1. The first direction DR1 may be a row direction, and the second direction DR2 may be a column direction. First pixel circuit parts PC1 may be disposed in the first direction DR1 and the second direction DR2 on the first display area of the substrate of the display device according to an embodiment. First pixel circuit parts PC1 disposed in the first direction DR1 may be electrically connected to a same scan line, and first pixel circuit parts PC1 disposed in the second direction DR2 may be electrically connected to a same data line.

The first light-emitting element ED1 may include a first sub-light-emitting element E1R, a second sub-light-emitting element E1B, a third sub-light-emitting element E1G1, and a fourth sub-light-emitting element E1G2. Each of the first sub-light-emitting element E1R, the second sub-light-emitting element E1B, the third sub-light-emitting element E1G1, and the fourth sub-light-emitting element E1G2 may emit light of a predetermined color. For example, the first sub-light-emitting element E1R may emit red light, and the second sub-light-emitting element E1B may emit blue light. The third sub-light-emitting element E1G1 and the fourth sub-light-emitting element E1G2 may emit green light. The first sub-light-emitting element E1R and the third sub-lightemitting element E1G1 may be adjacent to each other in the first direction DR1, and the second sub-light-emitting element E1B and the fourth sub-light-emitting element E1G2 may be adjacent to each other in the first direction DR1. The first sub-light-emitting element E1R and the second sub-light-emitting element E1B may be adjacent to each other in the second direction DR2, and the third sub-light-emitting element E1G1 and the fourth sub-light-emitting element E1G2 may be adjacent to each other in the second direction DR2.

The first pixel circuit part PC1 may include a first sub-pixel circuit part P1R, a second sub-pixel circuit part P1B, a third sub-pixel circuit part P1G1, and a fourth sub-pixel circuit part P1G2. The first sub-pixel circuit part P1R may be electrically connected to the first sub-light-emitting element E1R, and they may overlap each other. The second sub-pixel circuit part P1B may be electrically connected to the second sub-light-emitting element E1B, and they may overlap each other. The third sub-pixel circuit part P1G1 may be electrically connected to the third sub-light-emitting element E1G1, and they may overlap each other. The fourth sub-pixel circuit part P1G2 may be electrically connected to the fourth sub-light-emitting element E1G2, and they may overlap each other. For example, the first pixel circuit part PC1 overlaps the first light-emitting element ED1 electrically connected thereto. The first sub-pixel circuit part P1R and the third sub-pixel circuit part P1G1 may be adjacent to each other in the first direction DR1, and the second sub-pixel circuit part P1B and the fourth sub-pixel circuit part P1G2 may be adjacent to each other in the first direction DR1. The first sub-pixel circuit part P1R and the second sub-pixel circuit part P1B may be adjacent to each other in the second direction DR2, and the third sub-pixel circuit part P1G1 and the fourth sub-pixel circuit part P1G2 may be adjacent to each other in the second direction DR2.

Four sub-pixel circuit parts P1R, P1B, P1G1, and P1G2 and four sub-light-emitting elements E1R, E1B, E1G1, and E1G2 may form a pixel group. Pixel groups may be repeatedly disposed in the first display area.

An arrangement shape of the second pixel circuit part PC2 and the second light-emitting element ED2 and a connection shape of the second light-emitting element ED2 in case that each second pixel circuit part PC2 is electrically connected to two second light-emitting elements ED2 are described with reference to FIGS. 7 and 8.

Figure 7:
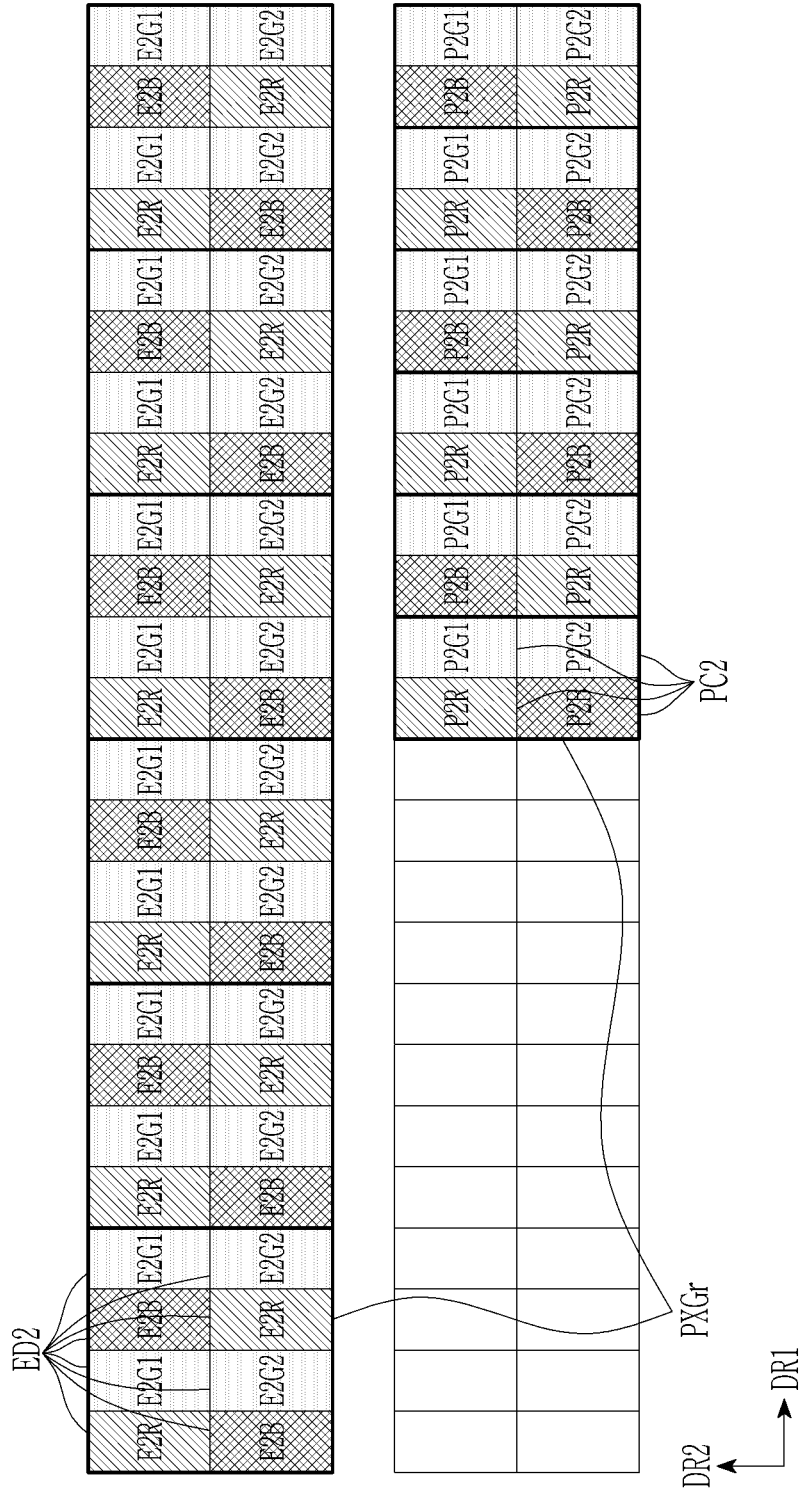
FIG. 7 is a schematic view respectively showing an arrangement shape of a second pixel circuit unit and an arrangement shape of a second light-emitting element in a display device according to an embodiment.

FIG. 7 is a schematic view respectively illustrating an arrangement shape of a second pixel circuit part and an arrangement shape of a second light-emitting element in a display device according to an embodiment. Although FIG. 7 separately illustrates the second pixel circuit part PC2 and the second light-emitting element ED2 for explanation, the second pixel circuit part PC2 may overlap some of the second light-emitting elements ED2. FIG. 8 is a schematic view illustrating a connection shape of second light-emitting elements of a display device according to an embodiment.

Figure 8:
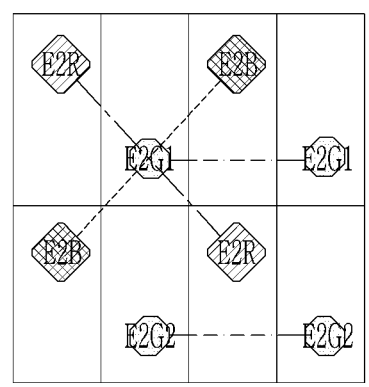
FIG. 8 is a schematic view showing a connection shape of second light-emitting elements of a display device according to an embodiment.

As shown in FIGS. 7 and 8, second light-emitting elements ED2 may be disposed on the second display area of the substrate of the display device according to an embodiment in the first direction DR1 and the second direction DR2. Second pixel circuit parts PC2 may be disposed in the first direction DR1 and the second direction DR2 on the second display area of the substrate of the display device according to an embodiment. Second pixel circuit parts PC2 disposed in the first direction DR1 may be electrically connected to a same scan line, and second pixel circuit parts PC2 disposed in the second direction DR2 may be electrically connected to a same data line.

The second light-emitting element ED2 may include a first sub-light-emitting element E2R, a second sub-light-emitting element E2B, a third sub-light-emitting element E2G1, and a fourth sub-light-emitting element E2G2. Each of the first sub-light-emitting element E2R, the second sub-light-emitting element E2B, the third sub-light-emitting element E2G1, and the fourth sub-light-emitting element E2G2 may emit light of a predetermined color. For example, the first sub-light-emitting element E2R may emit red light, and the second sub-light-emitting element E2B may emit blue light. The third sub-light-emitting element E2G1 and the fourth sub-light-emitting element E2G2 may emit green light. In a first row, the first sub-light-emitting element E2R, the third sub-light-emitting element E2G1, the second sub-light-emitting element E2B, and the third sub-light-emitting element E2G1 may be sequentially disposed in the first direction DR1. In a second row, the second sub-light-emitting element E2B, the fourth sub-light-emitting element E2G2, the first sub-light-emitting element E2R, and the fourth sub-light-emitting element E2G2 may be sequentially disposed in the first direction DR1. The first sub-light-emitting element E2R and the second sub-light-emitting element E2B may be adjacent to each other in the second direction DR2, and the third sub-light-emitting element E2G1 and the fourth sub-light-emitting element E2G2 may be adjacent to each other in the second direction DR2.

The second pixel circuit part PC2 may include a first sub-pixel circuit part P2R, a second sub-pixel circuit part P2B, a third sub-pixel circuit part P2G1, and a fourth sub-pixel circuit part P2G2. The first sub-pixel circuit part P2R may be electrically connected to the two first sub-light-emitting elements E2R. The second sub-pixel circuit part P2B may be electrically connected to the two second sub-light-emitting elements E2B. The third sub-pixel circuit part P2G1 may be electrically connected to the two third sub-light-emitting elements E2G1. The fourth sub-pixel circuit part P2G2 may be electrically connected to the two fourth sub-light-emitting elements E2G2. The second pixel circuit part PC2 may not overlap the second light-emitting element ED2 electrically connected thereto. The second pixel circuit part PC2 may overlap the second light-emitting element ED2 that is not electrically connected thereto. The first sub-pixel circuit part P2R and the third sub-pixel circuit part P2G1 may be adjacent to each other in the first direction DR1, and the second sub-pixel circuit part P2B and the fourth sub-pixel circuit part P2G2 may be adjacent to each other in the first direction DR1. The first sub-pixel circuit part P2R and the second sub-pixel circuit part P2B may be adjacent to each other in the second direction DR2, and the third sub-pixel circuit part P2G1 and the fourth sub-pixel circuit part P2G2 may be adjacent to each other in the second direction DR2.

The two first sub-light-emitting elements E2R electrically connected to the first sub-pixel circuit part P2R may be disposed in a third direction DR3. For example, the two first sub-light-emitting elements E2R adjacent to each other in the third direction DR3 are electrically connected to each other to receive a same signal and display a same luminance. The third direction DR3 may be an oblique direction with respect to the first direction DR1 and the second direction DR2. The two second sub-light-emitting element E2B electrically connected to the second sub-pixel circuit part P2B may be disposed in a fourth direction DR4. For example, two second sub-light-emitting elements E2B adjacent to each other in the fourth direction DR4 may be electrically connected to each other to receive a same signal and display a same luminance. The fourth direction DR4 may be an oblique direction with respect to the first direction DR1 and the second direction DR2. The fourth direction DR4 may be a direction that is perpendicular to the third direction DR3. The two third sub-light-emitting elements E2G1 electrically connected to the third sub-pixel circuit part P2G1 may be disposed in the first direction DR1. For example, two third sub-light-emitting elements E2G1 adjacent to each other in the first direction DR1 are electrically connected to each other to receive a same signal and display a same luminance. The two fourth sub-light-emitting elements E2G2 electrically connected to the fourth sub-pixel circuit part P2G2 may be disposed to each other in the first direction DR1. For example, two fourth sub-light-emitting elements E2G2 adjacent to each other in the first direction DR1 are electrically connected to each other to receive a same signal and display a same luminance.

Four sub-pixel circuit parts P2R, P2B, P2G1, and P2G2 and eight sub-light-emitting elements E2R, E2B, E2G1, and E2G2 may form a pixel group PXGr. Pixel groups PXGr may be repeatedly disposed in the second display area. The second pixel circuit part PC2 of a first pixel group PXGr positioned at a leftmost side may be electrically connected to the second light-emitting element ED2 of the first pixel group PXGr. The second pixel circuit part PC2 of the first pixel group PXGr may not overlap the second light-emitting element ED2 of the first pixel group PXGr. The second pixel circuit part PC2 of the first pixel group PXGr may overlap at least a portion of the second light-emitting element ED2 of the fourth pixel group PXGr. The second pixel circuit part PC2 of a second pixel group PXGr may overlap at least a portion of the second light-emitting element ED2 of the fourth pixel group PXGr. The second pixel circuit part PC2 of third and fourth pixel groups PXGr may overlap at least a portion of the second light-emitting element ED2 of a fifth pixel group PXGr. The second pixel circuit part PC2 of the fifth and sixth pixel groups PXGr may overlap at least a portion of the second light-emitting element ED2 of the sixth pixel group PXGr.

Figure 9:
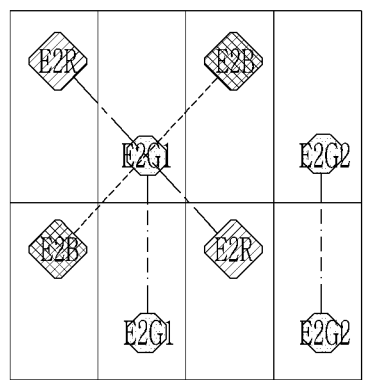
Figure 10:
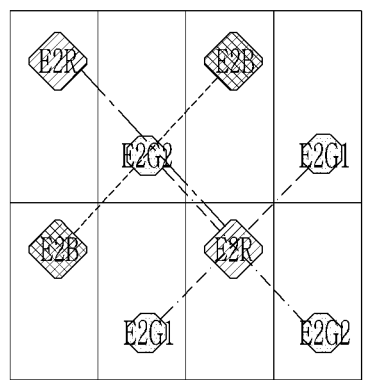

The connection shape of the third sub-light-emitting element E2G1 and the connection shape of the fourth sub-light-emitting element E2G2 may be variously changed, and the various connection shapes of the second light-emitting elements are described further with reference to FIGS. 9 to 11.

FIGS. 9 to 11 are schematic views illustrating various connection shapes of second light-emitting elements of a display device according to an embodiment.

As shown in FIG. 9, two third sub-light-emitting elements E2G1 electrically connected to the third sub-pixel circuit part P2G1 may be disposed in the second direction DR2. For example, two third sub-light-emitting elements E2G1 adjacent to each other in the second direction DR2 may be electrically connected to each other to receive a same signal and display a same luminance. Two fourth sub-light-emitting elements E2G2 electrically connected to the fourth sub-pixel circuit part P2G2 may be disposed in the second direction DR2.

For example, two fourth sub-light-emitting elements E2G2 adjacent to each other in the second direction DR2 may be electrically connected to each other to receive a same signal and display a same luminance. In this case, in the first row, the first sub-light-emitting element E2R, the third sub-light-emitting element E2G1, the second sub-light-emitting element E2B, and the fourth sub-light-emitting element E2G2 may be sequentially disposed in the first direction DR1. In the second row, the second sub-light-emitting element E2B, the third sub-light-emitting element E2G1, the first sub-light-emitting element E2R, and the fourth sub-light-emitting element E2G2 may be sequentially disposed in the first direction DR1.

As shown in FIG. 10, two third sub-light-emitting elements E2G1 electrically connected to the third sub-pixel circuit part P2G1 may be disposed in the fourth direction DR4. For example, two third sub-light-emitting elements E2G1 adjacent to each other in the fourth direction DR4 may be electrically connected to each other to receive a same signal and display a same luminance. Two fourth sub-light-emitting elements E2G2 electrically connected to the fourth sub-pixel circuit part P2G2 may be disposed in the third direction DR3. For example, two fourth sub-light-emitting elements E2G2 adjacent to each other in the third direction DR3 may be electrically connected to each other to receive a same signal and display a same luminance. In this case, in the first row, the first sub-light-emitting element E2R, the fourth sub-light-emitting element E2G2, the second sub-light-emitting element E2B, and the third sub-light-emitting element E2G1 may be sequentially disposed in the first direction DR1. In the second row, the second sub-light-emitting element E2B, the third sub-light-emitting element E2G1, the first sub-light-emitting element E2R, and the fourth sub-light-emitting element E2G2 may be sequentially disposed in the first direction DR1.

Conversely, two third sub-light-emitting elements E2G1 electrically connected to the third sub-pixel circuit part P2G1 may be disposed in the third direction DR3, and two fourth sub-light-emitting elements E2G2 electrically connected to the fourth sub-pixel circuit part P2G2 may be disposed in the fourth direction DR4.

As shown in FIG. 11, two third sub-light-emitting elements E2G1 electrically connected to the third sub-pixel circuit part P2G1 may be disposed in the second direction DR2. Two fourth sub-light-emitting elements E2G2 electrically connected to the fourth sub-pixel circuit part P2G2 may be disposed in the second direction DR2. In this case, at least one of the two third sub-light-emitting elements E2G1 may be electrically connected to at least one of the two fourth sub-light-emitting elements E2G2. For example, the third sub-light-emitting element E2G1 and the fourth sub-light-emitting element E2G2 positioned in the second row may be electrically connected to each other. However, the disclosure is not limited thereto, and the third sub-light-emitting element E2G1 and the fourth sub-light-emitting element E2G2 positioned in the first row may be electrically connected to each other. The third sub-light-emitting element E2G1 and the fourth sub-light-emitting element E2G2 positioned in the first row may be electrically connected to each other, and the third sub-light-emitting element E2G1 and the fourth sub-light-emitting element E2G2 positioned in the second row may be electrically connected to each other. In this case, for the third sub-light-emitting element E2G1 and the fourth sub-light-emitting element E2G2 electrically connected to each other, the pixel electrodes may be integral with each other or may be electrically connected by an extending wire.

The arrangement shape of the second pixel circuit part PC2 and the second light-emitting element ED2 and the connection shape of the second light-emitting element ED2 in case that each second pixel circuit part PC2 is electrically connected to three second light-emitting elements ED2, are described with reference to FIGS. 12 and 13.

Figure 12:
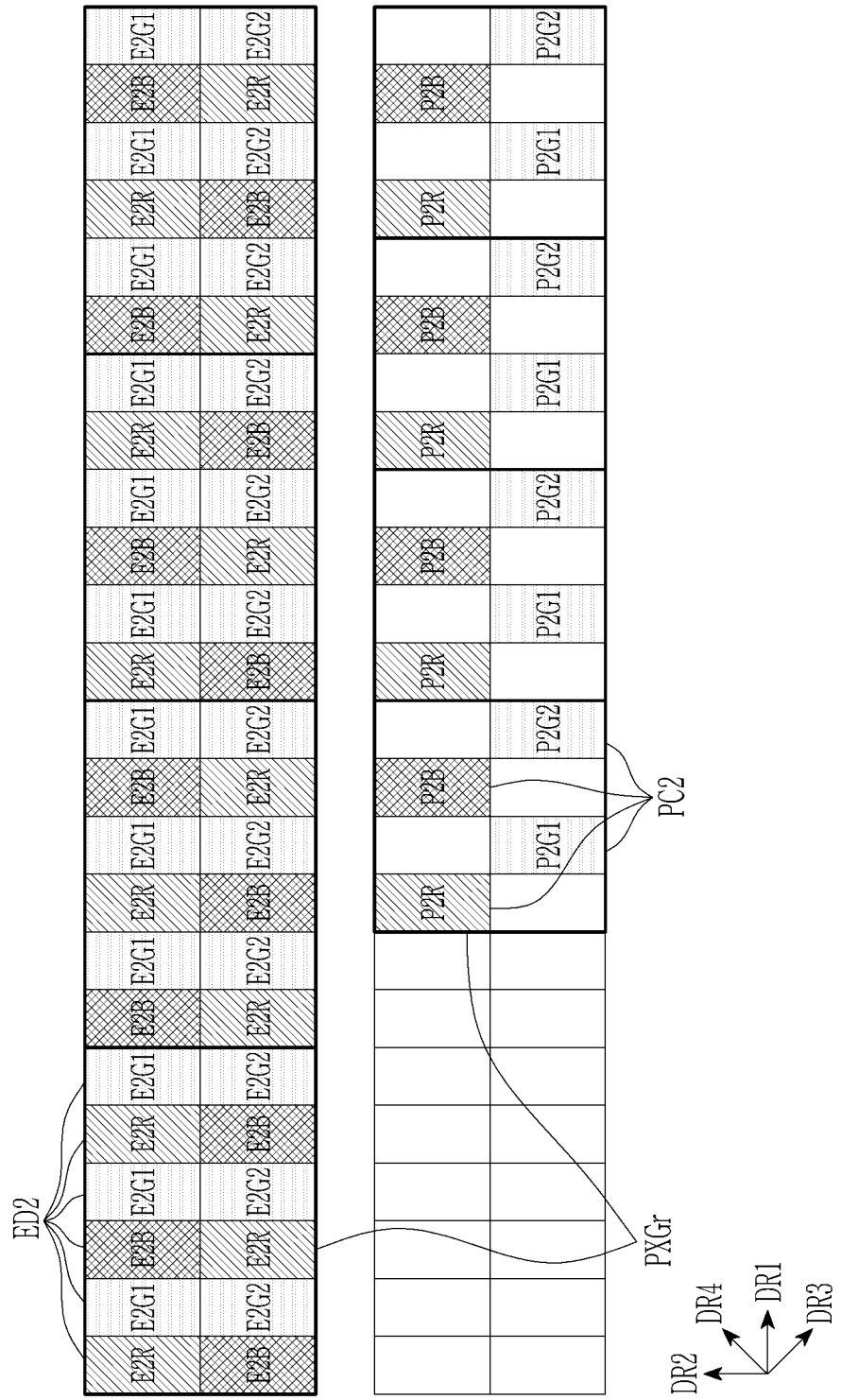
FIG. 12 is a schematic view respectively showing an arrangement shape of a second pixel circuit unit and an arrangement shape of a second light-emitting element in a display device according to an embodiment.

FIG. 12 is a schematic view respectively illustrating an arrangement shape of a second pixel circuit part and an arrangement shape of a second light-emitting element in a display device according to an embodiment. Although FIG.

12 separately illustrates the second pixel circuit part PC2 and the second light-emitting element ED2 for explanation, the second pixel circuit part PC2 may overlap some of the second light-emitting elements ED2. FIG. 13 is a schematic view illustrating a connection shape of second light-emitting elements of a display device according to an embodiment.

Figure 13:
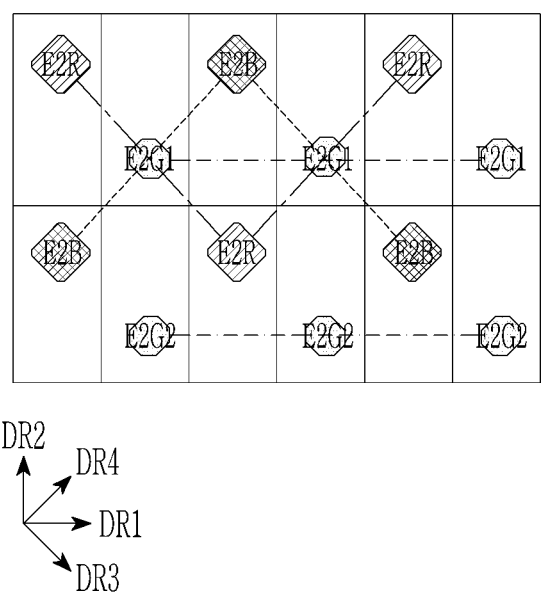
FIG. 13 is a schematic view showing a connection shape of second light-emitting elements of a display device according to an embodiment.

As shown in FIGS. 12 and 13, second light-emitting elements ED2 may be disposed in the first direction DR1 and the second direction DR2 on the second display area of the substrate of the display device according to an embodiment. Second pixel circuit parts PC2 may be disposed in a zigzag shape on the second display area of the substrate of the display device according to an embodiment. Second pixel circuit parts PC2 disposed in the first direction DR1 may be electrically connected to a same scan line. Although not shown in the drawings, second pixel circuit parts PC2 may be disposed in the second direction DR2, and they may be electrically connected to a same data line.

The second light-emitting element ED2 may include a first sub-light-emitting element E2R, a second sub-light-emitting element E2B, a third sub-light-emitting element E2G1, and a fourth sub-light-emitting element E2G2. Each of the first sub-light-emitting element E2R, the second sub-light-emitting element E2B, the third sub-light-emitting element E2G1, and the fourth sub-light-emitting element E2G2 may emit light of a predetermined color. For example, the first sub-light-emitting element E2R may emit red light, and the second sub-light-emitting element E2B may emit blue light. The third sub-light-emitting element E2G1 and the fourth sub-light-emitting element E2G2 may emit green light. In the first row, the first sub-light-emitting element E2R, the third sub-light-emitting element E2G1, the second sub-light-emitting element E2B, and the third sub-light-emitting element E2G1 may be sequentially disposed in the first direction DR1. In the second row, the second sub-light-emitting element E2B, the fourth sub-light-emitting element E2G2, the first sub-light-emitting element E2R, and the fourth sub-light-emitting element E2G2 may be sequentially disposed in the first direction DR1. The first sub-light-emitting element E2R and the second sub-light-emitting element E2B may be adjacent to each other in the second direction DR2, and the third sub-light-emitting element E2G1 and the fourth sub-light-emitting element E2G2 may be adjacent to each other in the second direction DR2.

The second pixel circuit part PC2 may include a first sub-pixel circuit part P2R, a second sub-pixel circuit part P2B, a third sub-pixel circuit part P2G1, and a fourth sub-pixel circuit part P2G2. The first sub-pixel circuit part P2R may be electrically connected to the three first sub-light-emitting elements E2R. The second sub-pixel circuit part P2B may be electrically connected to the three second sub-light-emitting elements E2B. The third sub-pixel circuit part P2G1 may be electrically connected to the three third sub-light-emitting elements E2G1. The fourth sub-pixel circuit part P2G2 may be electrically connected to the three fourth sub-light-emitting elements E2G2. The second pixel circuit part PC2 may not overlap the second light-emitting element ED2 electrically connected thereto. The second pixel circuit part PC2 may overlap the second light-emitting element ED2 that is not electrically connected thereto. The first sub-pixel circuit part P2R and the second sub-pixel circuit part P2B may be adjacent to each other in the first direction DR1, and the third sub-pixel circuit part P2G1 and the fourth sub-pixel circuit part P2G2 may be adjacent to each other in the first direction DR1. The first sub-pixel circuit part P2R and the third sub-pixel circuit part P2G1 may be adjacent to each other in the third direction DR3, and the second sub-pixel circuit part P2B and the fourth sub-pixel circuit part P2G2 may be adjacent to each other in the third direction DR3. The first sub-pixel circuit part P2R, the third sub-pixel circuit part P2G1, the second sub-pixel circuit part P2B, and the fourth sub-pixel circuit part P2G2 may be disposed in a zigzag shape. In the embodiment, since the area occupied by the second pixel circuit part PC2 may be designed more widely than in the previous embodiment, sufficient capacitance may be secured.

Three first sub-light-emitting elements E2R electrically connected to the first sub-pixel circuit part P2R may be positioned at each vertex of an imaginary triangle. In this case, each side of the imaginary triangle may be parallel to the first direction DR1, the third direction DR3, and the fourth direction DR4. The three adjacent first sub-light-emitting elements E2R may be electrically connected to each other to receive a same signal and display a same luminance. Three second sub-light-emitting elements E2B electrically connected to the second sub-pixel circuit part P2B may be positioned at each vertex of the imaginary triangle. In this case, each side of the imaginary triangle may be parallel to the first direction DR1, the third direction DR3, and the fourth direction DR4. The three adjacent second sub-light-emitting elements E2B may be electrically connected to each other to receive a same signal and display a same luminance. Three third sub-light-emitting elements E2G1 electrically connected to the third sub-pixel circuit part P2G1 may be disposed in the first direction DR1. For example, the three third sub-light-emitting elements E2G1 adjacent to each other in the first direction DR1 may be electrically connected to each other to receive a same signal and display a same luminance. Three fourth sub-light-emitting elements E2G2 electrically connected to the fourth sub-pixel circuit part P2G2 may be disposed in the first direction DR1. For example, three fourth sub-light-emitting elements E2G2 adjacent to each other in the first direction DR1 may be electrically connected to each other to receive a same signal and display a same luminance.

Four sub-pixel circuit parts P2R, P2B, P2G1, and P2G2 and twelve sub-light-emitting elements E2R, E2B, E2G1, and E2G2 may form a pixel group PXGr. Pixel groups PXGr may be repeatedly disposed in the second display area. The second pixel circuit part PC2 of the first pixel group PXGr positioned at a leftmost side may be electrically connected to the second light-emitting element ED2 of the first pixel group PXGr. The second pixel circuit part PC2 of the first pixel group PXGr may not overlap the second light-emitting element ED2 of the first pixel group PXGr. The second pixel circuit part PC2 of the first pixel group PXGr may overlap at least a portion of the second light-emitting element ED2 of the second pixel group PXGr. The second pixel circuit part PC2 of the second pixel group PXGr may overlap at least a portion of the second light-emitting element ED2 of the third pixel group PXGr. The second pixel circuit part PC2 of the third pixel group PXGr may overlap at least a portion of the second light-emitting element ED2 of the third pixel group PXGr, and at least a portion of the second light-emitting element ED2 of the fourth pixel group PXGr. The second pixel circuit part PC2 of the fourth pixel group PXGr may overlap at least a portion of the second light-emitting element ED2 of the fourth pixel group PXGr.

The connection shape of the third sub-light-emitting element E2G1 and the connection shape of the fourth sub-light-emitting element E2G2 may be variously changed, and the various connection shapes of the second light-emitting elements are described further with reference to FIGS. 14 to 17.

FIGS. 14 to 17 are schematic views illustrating various connection shapes of second light-emitting elements of a display device according to an embodiment.

Figure 14:
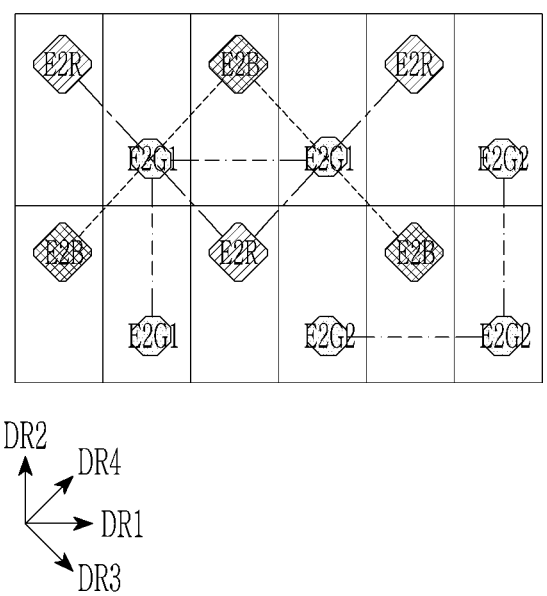
FIG. 14 to FIG. 17 are schematic views showing various connection shapes of second light-emitting elements of a display device according to an embodiment.

As shown in FIG. 14, three third sub-light-emitting elements E2G1 electrically connected to the third sub-pixel circuit part P2G1 may be positioned at each vertex of the imaginary triangle. In this case, each side of the imaginary triangle may be parallel to the first direction DR1, the second direction DR2, and the fourth direction DR4. The three adjacent third sub-light-emitting elements E2G1 may be electrically connected to each other to receive a same signal and display a same luminance. The three fourth sub-light-emitting elements E2G2 electrically connected to the fourth sub-pixel circuit part P2G2 may be positioned at each vertex of the imaginary triangle. In this case, each side of the imaginary triangle may be parallel to the first direction DR1, the second direction DR2, and the fourth direction DR4. The three adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the third sub-light-emitting element E2G1, the first sub-light-emitting element E2R, and the fourth sub-light-emitting element E2G2 may be sequentially disposed in the first direction DR1. In the second row, the second sub-light-emitting element E2B, the third sub-light-emitting element E2G1, the first sub-light-emitting element E2R, the fourth sub-light-emitting element E2G2, the second sub-light-emitting element E2B, and the fourth sub-light-emitting element E2G2 may be sequentially disposed in the first direction DR1.

Figure 15:
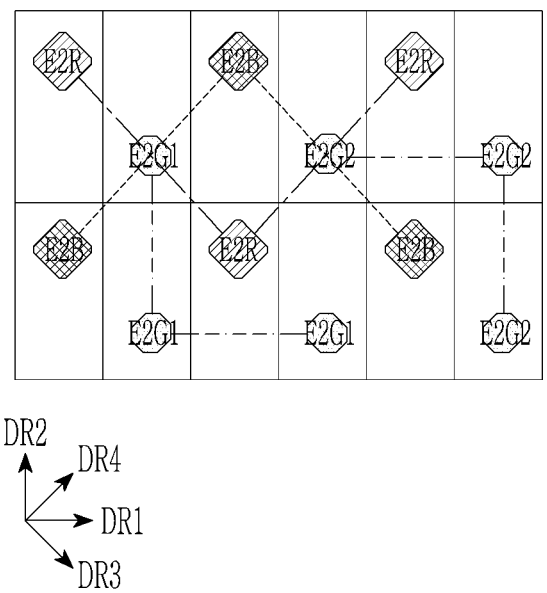

As shown in FIG. 15, three third sub-light-emitting elements E2G1 electrically connected to the third sub-pixel circuit part P2G1 may be positioned at each vertex of the imaginary triangle. In this case, each side of the imaginary triangle may be parallel to the first direction DR1, the second direction DR2, and the third direction DR3. The three adjacent third sub-light-emitting elements E2G1 may be electrically connected to each other to receive a same signal and display a same luminance. Three fourth sub-light-emitting elements E2G2 electrically connected to the fourth sub-pixel circuit part P2G2 may be positioned at each vertex of the imaginary triangle. In this case, each side of the imaginary triangle may be parallel to the first direction DR1, the second direction DR2, and the third direction DR3. The three adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the fourth sub-light-emitting element E2G2, the first sub-light-emitting element E2R, and the fourth sub-light-emitting element E2G2 may be sequentially disposed in the first direction DR1. In the second row, the second sub-light-emitting element E2B, the third sub-light-emitting element E2G1, the first sub-light-emitting element E2R, the third sub-light-emitting element E2G1, the second sub-light-emitting element E2B, and the fourth sub-light-emitting element E2G2 may be sequentially disposed in the first direction DR1.

Figure 16:
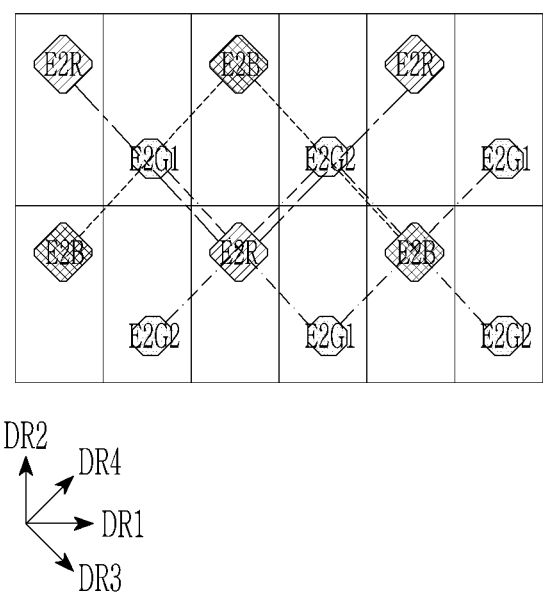

As shown in FIG. 16, three third sub-light-emitting elements E2G1 electrically connected to the third sub-pixel circuit part P2G1 may be positioned at each vertex of the imaginary triangle. In this case, each side of the imaginary triangle may be parallel to the first direction DR1, the third direction DR3, and the fourth direction DR4. The three adjacent third sub-light-emitting elements E2G1 may be electrically connected to each other to receive a same signal and display a same luminance. The three fourth sub-light-emitting elements E2G2 electrically connected to the fourth sub-pixel circuit part P2G2 may be positioned at each vertex of the imaginary triangle. In this case, each side of the imaginary triangle may be parallel to the first direction DR1, the third direction DR3, and the fourth direction DR4. The three adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the fourth sub-light-emitting element E2G2, the first sub-light-emitting element E2R, and the third sub-light-emitting element E2G1 may be sequentially disposed in the first direction DR1. In the second row, the second sub-light-emitting element E2B, the fourth sub-light-emitting element E2G2, the first sub-light-emitting element E2R, the third sub-light-emitting element E2G1, the second sub-light-emitting element E2B, and the fourth sub-light-emitting element E2G2 may be sequentially disposed in the first direction DR1.

Figure 17:
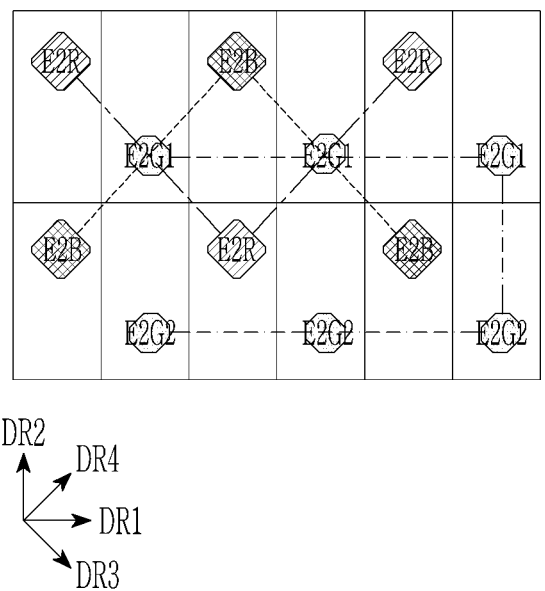

As shown in FIG. 17, three third sub-light-emitting elements E2G1 electrically connected to the third sub-pixel circuit part P2G1 may be disposed in the first direction DR1. The three fourth sub-light-emitting elements E2G2 electrically connected to the fourth sub-pixel circuit part P2G2 may be disposed in the first direction DR1. In this case, at least one of the three third sub-light-emitting elements E2G1 may be electrically connected to at least one of the three fourth sub-light-emitting elements E2G2. For example, the third sub-light-emitting element E2G1 and the fourth sub-light-emitting element E2G2 positioned in the sixth column may be electrically connected to each other. However, the disclosure is not limited thereto, and the third sub-light-emitting element E2G1 and the fourth sub-light-emitting element E2G2 positioned in the second column may be electrically connected to each other. The third sub-light-emitting element E2G1 and the fourth sub-light-emitting element E2G2 positioned in the second column may electrically connected to each other, and the third sub-light-emitting element E2G1 and the fourth sub-light-emitting element E2G1 positioned in the fourth column may be electrically connected to each other. The third sub-light-emitting element E2G1 and the fourth sub-light-emitting element E2G2 positioned in the sixth column may be electrically connected to each other. In this case, for the third sub-light-emitting element E2G1 and the fourth sub-light-emitting element E2G2 electrically connected to each other, the pixel electrodes may be integral with each other or may be electrically connected by an extending wire.

Next, an arrangement shape of the second pixel circuit part PC2 and the second light-emitting element ED2 and a connection shape of the second light-emitting element ED2 in case that each second pixel circuit part PC2 is electrically connected to four second light-emitting elements ED2 are described with reference to FIGS. 18 and 19.

Figure 18:
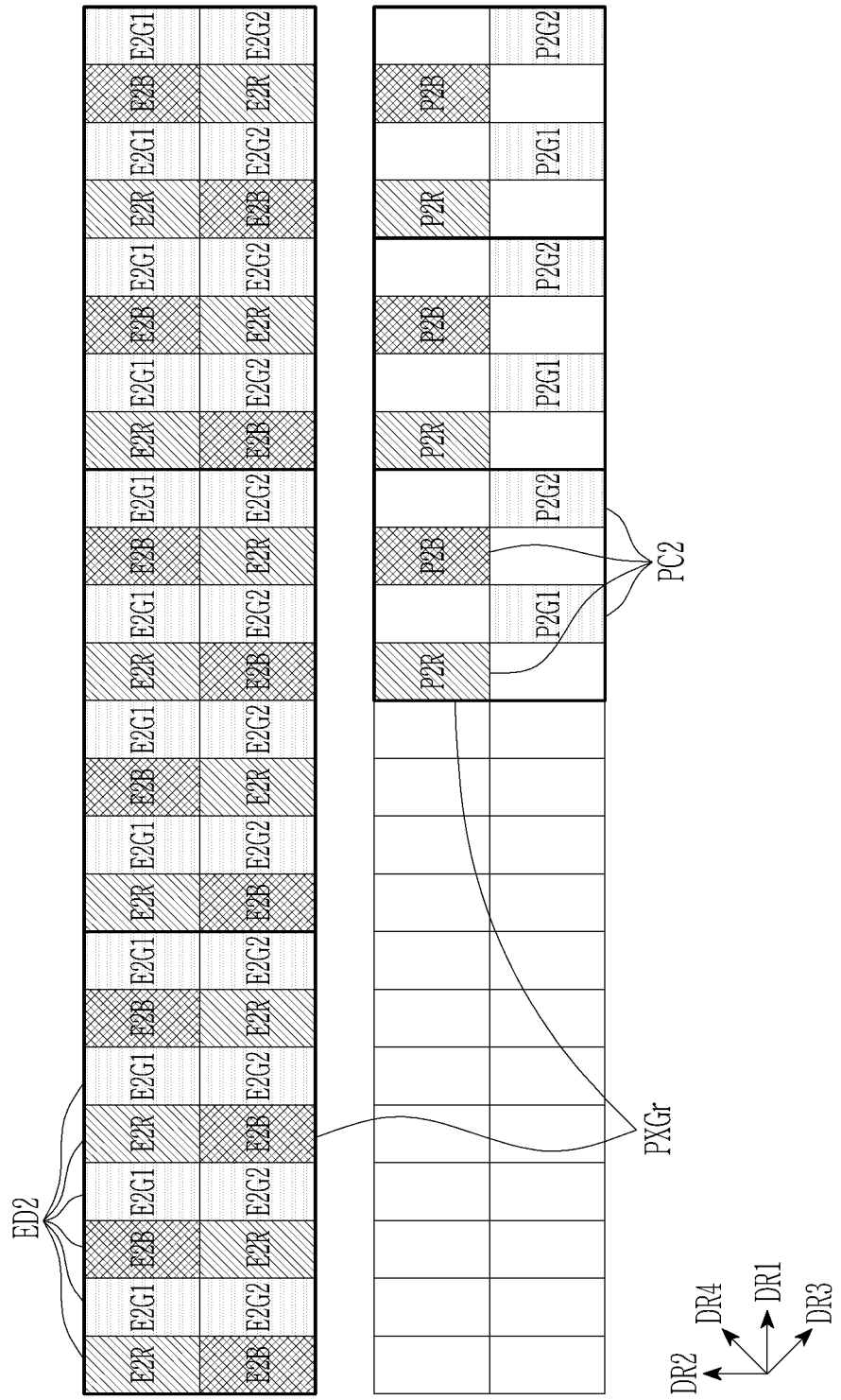
FIG. 18 is a schematic view respectively showing an arrangement shape of a second pixel circuit unit and an arrangement shape of a second light-emitting element in a display device according to an embodiment.

FIG. 18 is a schematic view respectively illustrating an arrangement shape of a second pixel circuit part and an arrangement shape of a second light-emitting element in a display device according to an embodiment. Although FIG. 18 separately illustrates the second pixel circuit part PC2 and the second light-emitting element ED2 for explanation, the second pixel circuit part PC2 may overlap some of the second light-emitting elements ED2. FIG. 19 is a schematic view illustrating a connection shape of second light-emitting elements of a display device according to an embodiment.

As shown in FIGS. 18 and 19, second light-emitting elements ED2 may be disposed in the first direction DR1 and the second direction DR2 on the second display area of the substrate of the display device according to an embodiment. Second pixel circuit parts PC2 may be disposed in a zigzag shape on the second display area of the substrate of the display device according to an embodiment. Second pixel circuit parts PC2 disposed in the first direction DR1 may be electrically connected to a same scan line. Although not shown in the drawings, second pixel circuit parts PC2 are disposed in the second direction DR2, and they may be electrically connected to a same data line.

The second light-emitting element ED2 may include a first sub-light-emitting element E2R, a second sub-light-emitting element E2B, a third sub-light-emitting element E2G1, and a fourth sub-light-emitting element E2G2. Each of the first sub-light-emitting element E2R, the second sub-light-emitting element E2B, the third sub-light-emitting element E2G1, and the fourth sub-light-emitting element E2G2 may emit light of a predetermined color. For example, the first sub-light-emitting element E2R may emit red light, and the second sub-light-emitting element E2B may emit blue light. The third sub-light-emitting element E2G1 and the fourth sub-light-emitting element E2G2 may emit green light. In the first row, the first sub-light-emitting element E2R, the third sub-light-emitting element E2G1, the second sub-light-emitting element E2B, and the third sub-light-emitting element E2G1 may be sequentially disposed in the first direction DR1. In the second row, the second sub-light-emitting element E2B, the fourth sub-light-emitting element E2G2, the first sub-light-emitting element E2R, and the fourth sub-light-emitting element E2G2 may be sequentially disposed in the first direction DR1. The first sub-light-emitting element E2R and the second sub-light-emitting element E2B may be adjacent to each other in the second direction DR2, and the third sub-light-emitting element E2G1 and the fourth sub-light-emitting element E2G2 may be adjacent to each other in the second direction DR2.

The second pixel circuit part PC2 may include a first sub-pixel circuit part P2R, a second sub-pixel circuit part P2B, a third sub-pixel circuit part P2G1, and a fourth sub-pixel circuit part P2G2. The first sub-pixel circuit part P2R may be electrically connected to four first sub-light-emitting elements E2R. The second sub-pixel circuit part P2B may be electrically connected to four second sub-light-emitting elements E2B. The third sub-pixel circuit part P2G1 may be electrically connected to four third sub-light-emitting elements E2G1. The fourth sub-pixel circuit part P2G2 may be electrically connected to four fourth sub-light-emitting elements E2G2. The second pixel circuit part PC2 may not overlap the second light-emitting element ED2 electrically connected thereto. The second pixel circuit part PC2 may overlap the second light-emitting element ED2 that is not electrically connected thereto. The first sub-pixel circuit part P2R and the second sub-pixel circuit part P2B may be adjacent to each other in the first direction DR1, and the third sub-pixel circuit part P2G1 and the fourth sub-pixel circuit part P2G2 may be adjacent to each other in the first direction DR1. The first sub-pixel circuit part P2R and the third sub-pixel circuit part P2G1 may be adjacent to each other in the third direction DR3, and the second sub-pixel circuit part P2B and the fourth sub-pixel circuit part P2G2 may be adjacent to each other in the third direction DR3. The first sub-pixel circuit part P2R, the third sub-pixel circuit part P2G1, the second sub-pixel circuit part P2B, and the fourth sub-pixel circuit part P2G2 may be disposed in a zigzag shape. In the embodiment, since the area occupied by the second pixel circuit part PC2 may be designed more widely than in the previous embodiment, sufficient capacitance may be secured.

The four first sub-light-emitting elements E2R electrically connected to the first sub-pixel circuit part P2R may be disposed in a zigzag shape. The four first sub-light-emitting elements E2R may be electrically connected to each other in the third direction DR3 and the fourth direction DR4 to receive a same signal and display a same luminance. The four second sub-light-emitting elements E2B electrically connected to the second sub-pixel circuit part P2B may be disposed in a zigzag shape. The four second sub-light-emitting elements E2B may be electrically connected to each other in the fourth direction DR4 and the third direction DR3 to receive a same signal and display a same luminance. The four third sub-light-emitting elements E2G1 electrically connected to the third sub-pixel circuit part P2G1 may be disposed in the first direction DR1. For example, the three third sub-light-emitting elements E2G1 adjacent to each other in the first direction DR1 are electrically connected to each other to receive a same signal and display a same luminance. The four fourth sub-light-emitting elements E2G2 electrically connected to the fourth sub-pixel circuit part P2G2 may be disposed in the first direction DR1. For example, the four fourth sub-light-emitting elements E2G2 adjacent to each other in the first direction DR1 may be electrically connected to each other to receive a same signal and display a same luminance.

Four sub-pixel circuit parts P2R, P2B, P2G1, and P2G2 and sixteen sub-light-emitting elements E2R, E2B, E2G1, and E2G2 may form a pixel group PXGr. Pixel groups PXGr may be repeatedly disposed in the second display area. The second pixel circuit part PC2 of the first pixel group PXGr positioned at a leftmost side may be electrically connected to the second light-emitting element ED2 of the first pixel group PXGr. The second pixel circuit part PC2 of the first pixel group PXGr may not overlap the second light-emitting element ED2 of the first pixel group PXGr. The second pixel circuit part PC2 of the first pixel group PXGr may overlap at least a portion of the second light-emitting element ED2 of the second pixel group PXGr. The second pixel circuit part PC2 of the second and third pixel groups PXGr may overlap at least a portion of the second light-emitting element ED2 of the third pixel group PXGr.

The connection shape of the third sub-light-emitting element E2G1 and the connection shape of the fourth sub-light-emitting element E2G2 may be variously changed, and the various connection shapes of the second light-emitting elements are described with reference to FIGS. 20 to 25.

FIGS. 20 to 25 are schematic views illustrating various connection shapes of second light-emitting elements of a display device according to an embodiment.

As shown in FIG. 20, the four third sub-light-emitting elements E2G1 electrically connected to the third sub-pixel circuit part P2G1 may be positioned at the vertex or side of the imaginary triangle. The four adjacent third sub-light-emitting elements E2G1 may be electrically connected to each other to receive a same signal and display a same luminance. The four fourth sub-light-emitting elements E2G2 electrically connected to the fourth sub-pixel circuit part P2G2 may be positioned at the vertex or side of the imaginary triangle. The four adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the third sub-light-emitting element E2G1, the first sub-light-emitting element E2R, the third sub-light-emitting element E2G1, the second sub-light-emitting element E2B, and the fourth sub-light-emitting element E2G2 may be sequentially disposed in the first direction DR1. In the second row, the second sub-light-emitting element E2B, the third sub-light-emitting element E2G1, the first sub-light-emitting element E2R, the fourth sub-light-emitting element E2G2, the second sub-light-emitting element E2B, the fourth sub-light-emitting element E2G2, the first sub-light-emitting element E2R, and the fourth sub-light-emitting element E2G2 may be sequentially disposed in the first direction DR1.

As shown in FIG. 21, the four third sub-light-emitting elements E2G1 electrically connected to the third sub-pixel circuit part P2G1 may be positioned at the vertex or side of the imaginary triangle. The four adjacent third sub-light-emitting elements E2G1 may be electrically connected to each other to receive a same signal and display a same luminance. The four fourth sub-light-emitting elements E2G2 electrically connected to the fourth sub-pixel circuit part P2G2 may be positioned at the vertex or side of the imaginary triangle. The four adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the fourth sub-light-emitting element E2G2, the first sub-light-emitting element E2R, the fourth sub-light-emitting element E2G2, the second sub-light-emitting element E2B, and the fourth sub-light-emitting element E2G2 may be sequentially disposed in the first direction DR1. In the second row, the second sub-light-emitting element E2B, the third sub-light-emitting element E2G1, the first sub-light-emitting element E2R, the third sub-light-emitting element E2G1, the second sub-light-emitting element E2B, the third sub-light-emitting element E2G1, the first sub-light-emitting element E2R, and the fourth sub-light-emitting element E2G2 may be sequentially disposed in the first direction DR1.

Figure 22:
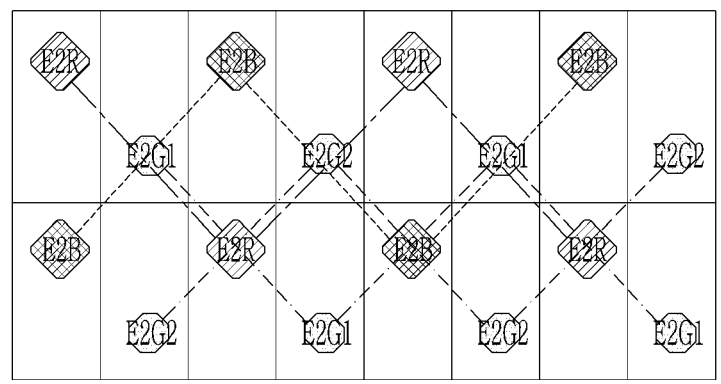

As shown in FIG. 22, the four third sub-light-emitting elements E2G1 electrically connected to the third sub-pixel circuit part P2G1 may be disposed in a zigzag shape. The four third sub-light-emitting elements E2G1 may be electrically connected to each other in the third direction DR3 and the fourth direction DR4 to receive a same signal and display a same luminance. Four fourth sub-light-emitting elements E2G2 electrically connected to the fourth sub-pixel circuit part P2G2 may be disposed in a zigzag shape. The four fourth sub-light-emitting elements E2G2 are electrically connected to each other in the third direction DR3 and the fourth direction DR4 to receive a same signal and display a same luminance. In this case, in the first row, the first sub-light-emitting element E2R, the third sub-light-emitting element E2G1, the second sub-light-emitting element E2B, the fourth sub-light-emitting element E2G2, the first sub-light-emitting element E2R, the third sub-light-emitting element E2G1, the second sub-light-emitting element E2B, and the fourth sub-light-emitting element E2G2 may be sequentially disposed in the first direction DR1. In the second row, the second sub-light-emitting element E2B, the fourth sub-light-emitting element E2G2, the first sub-light-emitting element E2R, the third sub-light-emitting element E2G1, the second sub-light-emitting element E2B, the fourth sub-light-emitting element E2G2, the first sub-light-emitting element E2R, and the third sub-light-emitting element E2G1 may be sequentially disposed in the first direction DR1.

As shown in FIG. 23, the four third sub-light-emitting elements E2G1 electrically connected to the third sub-pixel circuit part P2G1 may be positioned at each vertex of the imaginary quadrangle. In this case, each side of the imaginary quadrangle may be parallel to the first direction DR1 and the second direction DR2. The four adjacent third sub-light-emitting elements E2G1 may be electrically connected to each other to receive a same signal and display a same luminance. The four fourth sub-light-emitting elements E2G2 electrically connected to the fourth sub-pixel circuit part P2G2 may be positioned at each vertex of the imaginary quadrangle. In this case, each side of the imaginary quadrangle may be parallel to the first direction DR1 and the second direction DR2. The four adjacent fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the third sub-light-emitting element E2G1, the first sub-light-emitting element E2R, the fourth sub-light-emitting element E2G2, the second sub-light-emitting element E2B, and the fourth sub-light-emitting element E2G2 may be sequentially disposed in the first direction DR1. In the second row, the second sub-light-emitting element E2B, the third sub-light-emitting element E2G1, the first sub-light-emitting element E2R, the third sub-light-emitting element E2G1, the second sub-light-emitting element E2B, the fourth sub-light-emitting element E2G2, the first sub-light-emitting element E2R, and the fourth sub-light-emitting element E2G2 may be sequentially disposed in the first direction DR1.

Figure 24:
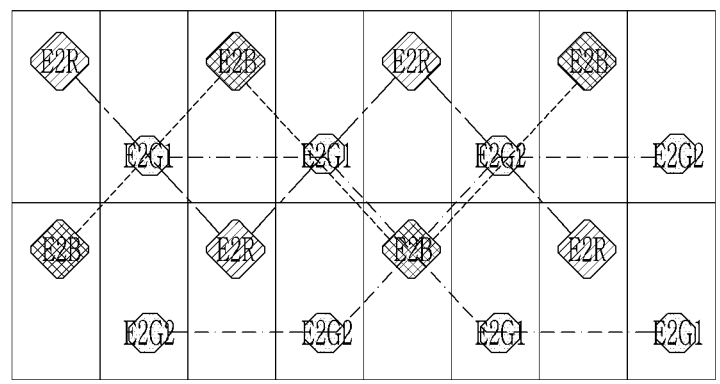

As shown in FIG. 24, the four third sub-light-emitting elements E2G1 electrically connected to the third sub-pixel circuit part P2G1 may be disposed in the first direction DR1 and the third direction DR3. The four third sub-light-emitting elements E2G1 may be electrically connected to each other to receive a same signal and display a same luminance. The four fourth sub-light-emitting elements E2G2 electrically connected to the fourth sub-pixel circuit part P2G2 may be disposed in the first direction DR1 and the fourth direction DR4. The four fourth sub-light-emitting elements E2G2 may be electrically connected to each other to receive a same signal and display a same luminance. In this case, in the first row, the first sub-light-emitting element E2R, the third sub-light-emitting element E2G1, the second sub-light-emitting element E2B, the third sub-light-emitting element E2G1, the first sub-light-emitting element E2R, the fourth sub-light-emitting element E2G2, the second sub-light-emitting element E2B, and the fourth sub-light-emitting element E2G2 may be sequentially disposed in the first direction DR1. In the second row, the second sub-light-emitting element E2B, the fourth sub-light-emitting element E2G2, the first sub-light-emitting element E2R, the fourth sub-light-emitting element E2G2, the second sub-light-emitting element E2B, the third sub-light-emitting element E2G1, the first sub-light-emitting element E2R, and the third sub-light-emitting element E2G1 may be sequentially dispose in the first direction DR1.

As shown in FIG. 25, the four third sub-light-emitting elements E2G1 electrically connected to the third sub-pixel circuit part P2G1 may be disposed in the first direction DR1. The four fourth sub-light-emitting elements E2G2 electrically connected to the fourth sub-pixel circuit part P2G2 may be disposed in the first direction DR1. In this case, at least one of the four third sub-light-emitting elements E2G1 may be electrically connected to at least one of the four fourth sub-light-emitting elements E2G2. For example, the third sub-light-emitting element E2G1 and the fourth sub-light-emitting element E2G2 positioned in the eighth column may be electrically connected to each other. However, the disclosure is not limited thereto, and the third sub-light-emitting element E2G1 and the fourth sub-light-emitting element E2G2 positioned in the second column may be electrically connected to each other. The third sub-light-emitting element E2G1 and the fourth sub-light-emitting element E2G2 positioned in the second column may be electrically connected to each other, the third sub-light-emitting element E2G1 and the fourth sub-light-emitting element E2G1 positioned in the fourth column may be electrically connected to each other, the third sub-light-emitting element E2G1 and the fourth sub-light-emitting element E2G2 positioned at the sixth column may be electrically connected to each other, and the third sub-light-emitting element E2G1 and the fourth sub-light-emitting element E2G2 positioned in the eighth column may be electrically connected to each other. In this case, for the third sub-light-emitting element E2G1 and the fourth sub-light-emitting element E2G2 electrically connected to each other, the pixel electrodes may be integral with each other or may be electrically connected by an extending wire.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising:
   a first display area and a second display area;
   a first pixel circuit part positioned in the first display area;
   a first light-emitting element electrically connected to the first pixel circuit part;
   a second pixel circuit part positioned in the second display area;
   an extending wire positioned in the second display area;
   second light-emitting elements including corresponding first electrodes electrically connected to and overlapping the extending wire in a plan view;
   a bridge electrode electrically connecting the second pixel circuit part to the extending wire, a portion of the bridge electrode being disposed in a same layer as and spaced apart from the corresponding first electrodes in the plan view; and
   a driving circuit part electrically connected to the first pixel circuit part and the second pixel circuit part, the driving circuit part overlapping at least one of the second light-emitting elements in the plan view.

2. The display device of claim 1, wherein
   the second pixel circuit part includes:
      a first sub-pixel circuit part;
      a second sub-pixel circuit part;
      a third sub-pixel circuit part; and
      a fourth sub-pixel circuit part, and
   the second light-emitting elements include:
      first sub-light-emitting elements electrically connected to the first sub-pixel circuit part;
      second sub-light-emitting elements electrically connected to the second sub-pixel circuit part;
      third sub-light-emitting elements electrically connected to the third sub-pixel circuit part; and
      fourth sub-light-emitting elements electrically connected to the fourth sub-pixel circuit part.

3. The display device of claim 2, wherein
   the first sub-light-emitting elements emit red light,
   the second sub-light-emitting elements emit blue light, and
   the third sub-light-emitting elements and the fourth sub-light-emitting elements emit green light.

4. The display device of claim 3, wherein
   the first sub-pixel circuit part and the third sub-pixel circuit part are adjacent in a first direction,
   the second sub-pixel circuit part and the fourth sub-pixel circuit part are adjacent in the first direction,
   the first sub-pixel circuit part and the second sub-pixel circuit part are adjacent in a second direction perpendicular to the first direction, and
   the third sub-pixel circuit part and the fourth sub-pixel circuit part are adjacent in the second direction.

5. The display device of claim 4, wherein
   the first sub-pixel circuit part is electrically connected to two of the first sub-light-emitting elements,
   the second sub-pixel circuit part is electrically connected to two of the second sub-light-emitting elements,
   the third sub-pixel circuit part is electrically connected to two of the third sub-light-emitting elements, and
   the fourth sub-pixel circuit part is electrically connected to two of the fourth sub-light-emitting elements.

6. A display device comprising:
   a first display area and a second display area;
   a first pixel circuit part positioned in the first display area;
   a first light-emitting element electrically connected to the first pixel circuit part;
   a second pixel circuit part positioned in the second display area;
   second light-emitting elements electrically connected to the second pixel circuit part; and
   a driving circuit part electrically connected to the first pixel circuit part and the second pixel circuit part, the driving circuit part overlapping the second light-emitting elements in a plan view, wherein
   the second pixel circuit part includes:
      a first sub-pixel circuit part;
      a second sub-pixel circuit part adjacent to the first sub-pixel part in a second direction;
      a third sub-pixel circuit part adjacent to the first sub-pixel part in a first direction perpendicular to the second direction; and
      a fourth sub-pixel circuit part adjacent to the second sub-pixel part in the first direction and adjacent to the third sub-pixel part in the second direction, and
   the second light-emitting elements include:
      first sub-light-emitting elements that emit red light and are electrically connected to the first sub-pixel circuit part;
      second sub-light-emitting elements that emit blue light and are electrically connected to the second sub-pixel circuit part;
      third sub-light-emitting elements that emit green light and are electrically connected to the third sub-pixel circuit part; and
      fourth sub-light-emitting elements that emit green light and area electrically connected to the fourth sub-pixel circuit part,
   two of the first sub-light-emitting elements electrically connected to the first sub-pixel circuit part are disposed in a third direction oblique to the first direction and the second direction, two of the second sub-light-emitting elements electrically connected to the second sub-pixel circuit part are disposed in a fourth direction oblique to the first direction and the second direction,
two of the third sub-light-emitting elements electrically connected to the third sub-pixel circuit part are disposed in one of the first direction, the second direction, the third direction, and the fourth direction, and
two of the fourth sub-light-emitting elements electrically connected to the fourth sub-pixel circuit part are disposed in one of the first direction, the second direction, the third direction, and the fourth direction.

7. The display device of claim 6, wherein the third sub-light-emitting element and the fourth sub-light-emitting element are electrically connected to each other.

8. A display device comprising:
a first display area and a second display area;
a first pixel circuit part positioned in the first display area;
a first light-emitting element electrically connected to the first pixel circuit part;
a second pixel circuit part positioned in the second display area;
second light-emitting elements electrically connected to the second pixel circuit part; and
a driving circuit part electrically connected to the first pixel circuit part and the second pixel circuit part, the driving circuit part overlapping the second light-emitting elements in a plan view, wherein
the second pixel circuit part includes:
a first sub-pixel circuit part;
a second sub-pixel circuit part;
a third sub-pixel circuit part; and
a fourth sub-pixel circuit part,
the second light-emitting elements include:
first sub-light-emitting elements that emit red light and are electrically connected to the first sub-pixel circuit part;
second sub-light-emitting elements that emit blue light and are electrically connected to the second sub-pixel circuit part;
third sub-light-emitting elements that emit green light and are electrically connected to the third sub-pixel circuit part; and
fourth sub-light-emitting elements that emit green light and are electrically connected to the fourth sub-pixel circuit part,
the first sub-pixel circuit part is electrically connected to at least three of the first sub-light-emitting elements,
the second sub-pixel circuit part is electrically connected to at least three of the second sub-light-emitting elements,
the third sub-pixel circuit part is electrically connected to at least three of the third sub-light-emitting elements, and
the fourth sub-pixel circuit part is electrically connected to at least three of the fourth sub-light-emitting elements.

9. The display device of claim 8, wherein
the first sub-pixel circuit part and the second sub-pixel circuit part are adjacent in a first direction,
the third sub-pixel circuit part and the fourth sub-pixel circuit part are adjacent in the first direction,
the first sub-pixel circuit part and the third sub-pixel circuit part are adjacent in a third direction oblique to the first direction, and
the second sub-pixel circuit part and the fourth sub-pixel circuit part are adjacent in the third direction.

10. The display device of claim 8, wherein
three of the at least three of the first sub-light-emitting elements electrically connected to the first sub-pixel circuit part are positioned at each vertex of a first imaginary triangle,
three of the at least three of the second sub-light-emitting elements electrically connected to the second sub-pixel circuit part are positioned at each vertex of a second imaginary triangle,
three of the at least three of the third sub-light-emitting elements electrically connected to the third sub-pixel circuit part are disposed in the first direction, and
three of the at least three of the fourth sub-light-emitting elements electrically connected to the fourth sub-pixel circuit part are disposed in the first direction.

11. The display device of claim 10, wherein at least some of the third sub-light-emitting elements are electrically connected to at least some of the fourth sub-light-emitting elements.

12. The display device of claim 8, wherein
three of the at least three of the first sub-light-emitting elements electrically connected to the first sub-pixel circuit part are positioned at each vertex of a first imaginary triangle,
three of the at least three of the second sub-light-emitting elements electrically connected to the second sub-pixel circuit part are positioned at each vertex of a second imaginary triangle,
three of the at least three of the third sub-light-emitting elements electrically connected to the third sub-pixel circuit part are positioned at each vertex of a third imaginary triangle, and
three of the at least three of the fourth sub-light-emitting elements electrically connected to the fourth sub-pixel circuit part are positioned at each vertex of a fourth imaginary triangle.

13. The display device of claim 8, wherein
the first sub-pixel circuit part is electrically connected to at least four of the first sub-light-emitting elements,
the second sub-pixel circuit part is electrically connected to at least four of the second sub-light-emitting elements,
the third sub-pixel circuit part is electrically connected to at least four of the third sub-light-emitting elements, and
the fourth sub-pixel circuit part is electrically connected to at least four of the fourth sub-light-emitting elements.

14. The display device of claim 13, wherein
four of the at least four of the first sub-light-emitting elements electrically connected to the first sub-pixel circuit part are disposed in a first zigzag shape in the plan view,
four of the at least four of the second sub-light-emitting elements electrically connected to the second sub-pixel circuit part are disposed in a second zigzag shape in the plan view,
four of the at least four of the third sub-light-emitting elements electrically connected to the third sub-pixel circuit part are disposed in the first direction, and
four of the at least four of the fourth sub-light-emitting elements electrically connected to the fourth sub-pixel circuit part are disposed in the first direction.

15. The display device of claim 14, wherein at least some of the third sub-light-emitting elements are electrically connected to at least some of the fourth sub-light-emitting elements.

16. The display device of claim 13, wherein
four of the at least four of the first sub-light-emitting elements electrically connected to the first sub-pixel circuit part are disposed in a first zigzag shape in the plan view,
four of the at least four of the second sub-light-emitting elements electrically connected to the second sub-pixel circuit part are disposed in a second zigzag shape in the plan view,
four of the at least four of the third sub-light-emitting elements electrically connected to the third sub-pixel circuit part are disposed at a vertex or side of a first imaginary triangle, or a vertex of a first imaginary quadrangle, and
four of the at least four of the fourth sub-light-emitting elements electrically connected to the fourth sub-pixel circuit part are disposed at a vertex or side of a second imaginary triangle, or a vertex of a second imaginary quadrangle.

17. The display device of claim 13, wherein
four of the at least four of the first sub-light-emitting elements electrically connected to the first sub-pixel circuit part are disposed in a first zigzag shape in the plan view,
four of the at least four of the second sub-light-emitting elements electrically connected to the second sub-pixel circuit part are disposed in a second zigzag shape in the plan view,
four of the at least four of the third sub-light-emitting elements electrically connected to the third sub-pixel circuit part are disposed in a third zigzag shape in the plan view, and
four of the at least four of the fourth sub-light-emitting elements electrically connected to the fourth sub-pixel circuit part are disposed in a fourth zigzag shape in the plan view.

18. The display device of claim 1, further comprising:
a shielding electrode disposed between the at least one of the second light-emitting elements and the driving circuit part, wherein
the shielding electrode overlaps the driving circuit part in the plan view, and
a portion of the extending wire overlaps the shielding electrode in the plan view.

19. The display device of claim 1, wherein
the first and second display areas form a display area displaying an image,
a peripheral area surrounds the display area in the plan view, and
the second display area is disposed between the first display area and the peripheral area.

20. The display device of claim 19, wherein
part of the driving circuit part is positioned in the second display area, and
another part of the driving circuit part is positioned in the peripheral area.

21. An electronic device comprising:
a display device, the display device comprising:
    a first display area and a second display area;
    a first pixel circuit part positioned in the first display area;
    a first light-emitting element electrically connected to the first pixel circuit part;
    a second pixel circuit part positioned in the second display area;
    an extending wire positioned in the second display area;
    second light-emitting elements including corresponding first electrodes electrically connected to and overlapping the extending wire in a plan view;
    a bridge electrode electrically connecting the second pixel circuit part to the extending wire, a portion of the bridge electrode being disposed in a same layer as and spaced apart from the corresponding first electrodes in the plan view; and
    a driving circuit part electrically connected to the first pixel circuit part and the second pixel circuit part, the driving circuit part overlapping at least one of the second light-emitting elements in the plan view.

22. The electronic display device of claim 21, wherein
the second pixel circuit part includes:
    a first sub-pixel circuit part;
    a second sub-pixel circuit part;
    a third sub-pixel circuit part; and
    a fourth sub-pixel circuit part, and
the second light-emitting elements include:
    first sub-light-emitting elements electrically connected to the first sub-pixel circuit part;
    second sub-light-emitting elements electrically connected to the second sub-pixel circuit part;
    third sub-light-emitting elements electrically connected to the third sub-pixel circuit part; and
    fourth sub-light-emitting elements electrically connected to the fourth sub-pixel circuit part.

* * * * *